United States Patent
Suda et al.

(10) Patent No.: US 7,112,779 B2
(45) Date of Patent: Sep. 26, 2006

(54) OPTICAL APPARATUS AND BEAM SPLITTER

(75) Inventors: Yasuo Suda, Yokohama (JP); Koichi Washisu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/141,347

(22) Filed: May 31, 2005

(65) Prior Publication Data

US 2005/0218297 A1    Oct. 6, 2005

Related U.S. Application Data

(63) Continuation of application No. PCT/JP2005/002493, filed on Feb. 17, 2005.

(30) Foreign Application Priority Data

Feb. 19, 2004  (JP)  ............... 2004-042346

(51) Int. Cl.
*H01J 5/16*    (2006.01)

(52) U.S. Cl. ............... 250/226; 250/216; 250/214 AG; 250/214 C; 348/251; 382/274

(58) Field of Classification Search ............ 250/214 A, 250/214 AG, 208.1, 226, 216, 214 C; 348/251; 396/384; 382/270, 274

See application file for complete search history.

(56) References Cited

U.S. PATENT DOCUMENTS

| | | | | |
|---|---|---|---|---|
| 4,520,395 A | * | 5/1985 | Abe | 348/251 |
| 4,639,781 A | * | 1/1987 | Rucci et al. | 348/251 |
| 6,205,259 B1 | * | 3/2001 | Komiya et al. | 382/284 |
| 6,825,882 B1 | * | 11/2004 | Shono | 348/341 |
| 6,940,546 B1 | * | 9/2005 | Gallagher | 348/224.1 |

FOREIGN PATENT DOCUMENTS

JP    2003140246 A  *  5/2003

* cited by examiner

*Primary Examiner*—Thanh X. Luu
*Assistant Examiner*—Stephen Yam
(74) *Attorney, Agent, or Firm*—Cowan, Liebowitz & Latman, P.C.

(57) ABSTRACT

An optical apparatus is disclosed, which can take high-quality images by using light transmitted through a beam splitter. The optical apparatus comprises a light-receiving element and a beam splitter. The first surface of the beam splitter reflects part of incident light and transmits the other part of the incident light toward the light-receiving element. The second surface transmits other incident light other than the incident light to the first surface toward the light-receiving element. The transmittance of the second surface is set so that a light amount distribution on the light-receiving element may be substantially even in a case where the light is incident to the first and second surfaces from an object having a substantially even luminance.

1 Claim, 22 Drawing Sheets

OPTICAL APPARATUS AND BEAM SPLITTER

CROSS-REFERENCE TO RELATED APPLICATIONS

This application is a continuation of International Application No. PCT/JP2005/002493, filed Feb. 17, 2005, the entire disclosure of which is hereby incorporated by reference.

FIELD OF THE INVENTION

The present invention relates to optical apparatuses such as cameras, especially optical apparatuses having an optical structure in which an optical path of a luminous flux taken through an image-forming optical system is divided into a plurality of optical paths and they are led to a light-receiving element, and beam splitter used therein.

BACKGROUND OF THE INVENTION

A single reflex digital camera is disclosed in Patent Document 1, in which an optical object image formed by an image-forming optical system is formed on a two-dimensional light-receiving sensor such as a CCD sensor or a CMOS sensor, and an image output of the object is obtained by photoelectric conversion of the optical image.

A beam splitter, which transmits light of a visible wavelength region without reducing the light amount and divides light of a wavelength close to the infrared region, is built in the single reflex digital camera. The light of the wavelength close to the infrared region divided by the beam splitter is used for focus detection, and the straight-advancing light is used for image-taking. Limiting the area of a beam splitting function surface in such a beam splitter within an area where the focus detection luminous flux passes can reduce the thickness of the beam splitter. Thereby, the beam splitter can be disposed in a small space between the image-forming optical system and a mirror that deflects the optical path toward a viewfinder optical system, without increasing the size of the camera. In addition, setting the spectral transmittance characteristic of the beam splitter to approximately 100% in the visible wavelength region can produce a bright and high-quality image without reducing the light amount of the visible wavelength region that is required for image-taking of objects.

A camera with a zoom lens is disclosed in Patent Document 2, in which focus detection is performed using a luminous flux divided in the middle of an optical path of the zoom lens.

Generally, in an optical structure in which an optical path of a luminous flux taken through an image-forming optical system is divided into a plurality of optical paths and they are led to a light-receiving element, the substantially same wavelength characteristics of the divided luminous fluxes often produce an advantage.

Since the light of the wavelength region close to the infrared region divided by the beam splitter is used for focus detection in the camera disclosed in Patent Document 1, aberration correction of the image-forming optical system in this wavelength region is required for performing the focus detection correctly. It is impossible to focus the camera exactly using the light of the wavelength close to the infrared region in a case where the aberration correction is not enough. On the other hand, the aberration correction in the wavelength region close to the infrared region in addition to the visible wavelength region requires use of a special glass or increase in the number of constituent lenses of the image-forming optical system, and thereby increasing in cost and size of the camera. This is not preferable. Especially, in a case where the image-forming optical system is interchangeable like a single reflex camera and a large-scale interchangeable lens system is provided for the camera, it is very difficult to realize the enough aberration correction in both the wavelength region close to the infrared region and the visible wavelength region because the entire interchangeable lens system must correspond to such a focus detection system.

In addition, the measurement of object luminance using the luminous flux divided by the beam splitter and the determination of image-taking exposure amount causes a phenomenon similar to the focus detection. In other words, an image-taking result with underexposure or overexposure will occur even if an image-taking is performed with the exposure amount determined based on the measurement of object luminance because the exact estimation of the light energy included in a wavelength region for the exposure from the light energy included in a wavelength region for the luminance measurement cannot be performed when the wavelength region for the exposure displaces from the wavelength region for the luminance measurement.

Such a problem can be prevented in principle if the wavelength characteristics of the divided luminous fluxes are substantially the same. In other words, it can be prevented if the spectral transmittance characteristic of the beam splitting function surface in the beam splitter becomes flat for a desired wavelength region.

[Patent Document 1]
Japanese Patent Laid-open Application No. 2003-140246

[Patent Document 2]
Japanese Patent Laid-open Application No. H63-195630

By the way, the area of the beam splitting function surface required for focus detection and object luminance measurement is generally set as a part of area through which a luminous flux for image-taking passes. However, actually, if the area of the beam splitting function surface is not set so as to cover the entire luminous flux for image-taking, uneven luminance will occur in an image taken by using the straight-advancing light, and thereby reducing the image quality. In addition, although uneven luminance will be hard to occur when the beam splitter is disposed in the vicinity of the pupil plane of the image-forming optical system, the contrast of the image will reduce because the amount of light passing through the center of the pupil reduces.

FIG. 30 is a pattern diagram of an optical apparatus, which shows an appearance of generation of the uneven luminance. In this figure, Reference numeral 901 denotes an image-forming optical system, 902 a light-receiving element, which has sensitivity to only the visible light, such as a photo film or a CCD sensor, 903 a beam splitter. The image taken by the light-receiving element 902 becomes a negative plate by developing if the optical apparatus is a film camera, or, is displayed on an electric viewfinder (EVF), recorded in a memory or printed out if the optical apparatus is a digital camera.

A dielectric multilayer film is formed on a beam splitting function surface 903a of the beam splitter 903. The 50% of the visible light component of the object light emerged from the image-forming optical system 901 is reflected by the beam splitting function surface 903a, and the remaining 50% of the visible light component is transmitted through the beam splitting function surface 903a. The light reflected by the beam splitting function surface 903*a* is totally reflected by a surface 903*b* of the beam splitter 903, and then passes through a surface 903*c* to emerge out of the beam splitter 903.

If the optical apparatus is an infrared camera, the light-receiving element 902 has sensitivity to only infrared light, and the beam splitting function surface 903*a* of the beam splitter 903 divides the infrared light.

In FIG. 30, since the amount of the visible light transmitted through the beam splitting function surface 903*a* reduces by half, if the object for image-taking is an even luminance surface, the image taken by the light-receiving element 902 will become like an image 910 in which bright areas 912 and 913 are formed above and below the dark center area 911. Such a phenomenon is not preferable because an unnatural luminance difference stands out in an area that should have even luminance when an image of a blue sky, white wall or the like is taken, and thereby resulting in deterioration of the image quality.

In the camera disclosed in Patent Document 2, the uneven luminance is prevented by making most light advance straight through the beam splitter. In other words, the most straight-advancing light is used for image-taking, and the remaining light is used for focus detection. However, the light amount for focus detection becomes insufficient though the uneven luminance can be eliminated in some degree, and thereby resulting in an inadequacy of the focus detection accuracy for low luminance objects.

BRIEF SUMMARY OF THE INVENTION

An object of the present invention is to provide an optical apparatus which can take high-quality images by using light transmitted through a beam splitter without increasing the size of the apparatus, and a beam splitter used for the optical apparatus.

An optical apparatus as an aspect of the present invention comprises: a light-receiving element, which has sensitivity to light in a predetermined wavelength region; and a beam splitter, which has an inclination angle with respect to an incident optical axis and includes a first surface and a second surface. The first surface reflects part of incident light in the predetermined wavelength region and transmits the other part of the incident light toward the light-receiving element, and the second surface is formed so as to be orthogonal to the incident optical axis and to contact with the first surface. The second surface transmits other incident light in the predetermined wavelength region other than the incident light to the first surface toward the light-receiving element. The transmittance of the second surface for the predetermined wavelength region is set so that a light amount distribution on the light-receiving element may be substantially even in a case where the light is incident to the first and second surfaces from an object having a substantially even luminance.

An optical apparatus as another aspect of the present invention comprises: a light-receiving element, which has sensitivity to light in a predetermined wavelength region; and a beam splitter, which has an inclination angle with respect to an incident optical axis and includes a first surface and a second surface. The first surface reflects part of incident light in the predetermined wavelength region and transmits the other part of the incident light toward the light-receiving element, and the second surface is formed so as to be orthogonal to the incident optical axis and to contact with the first surface. The second surface transmits incident light in the predetermined wavelength region other than the incident light to the first surface toward the light-receiving element. The optical apparatus further comprises a gain adjuster, which adjusts a gain to an output from the light-receiving element in a case where the light from an object having a substantially even luminance is incident into the first and second surfaces so as to make an output distribution after adjustment substantially even.

An optical apparatus as another aspect of the present invention comprises: a light-receiving element, which has sensitivity to light; and a beam splitter, which has a first region and a second region. The first region includes a beam splitting surface that reflects part of incident light and transmits the other part of the incident light toward the light-receiving element. The second region transmits incident light other than the incident light to the first region toward the light-receiving element. The transmittance of the second region is substantially the same as that of the first region.

A beam splitter as another aspect of the present invention comprises: a first region, which includes a beam splitting surface that reflects part of incident light and transmits the other part of the incident light; and a second region, which transmits incident light in the predetermined wavelength region other than the incident light to the first region. The transmittance of the second region is substantially the same as that of the first region.

An optical apparatus as another aspect of the present invention comprises: a light-receiving element, which has sensitivity to light; and a beam splitter, which has a first region and a second region. The first region includes a beam splitting surface that reflects part of incident light and transmits the other part of the incident light toward the light-receiving element, and the second region transmits incident light other than the incident light to the first region toward the light-receiving element. The optical apparatus further comprises a processor, which performs image processing for making a luminance distribution of an image that is obtained using the light-receiving element substantially even in a case where the light from an object having a substantially even luminance is incident to the first and second regions.

An optical apparatus as another aspect of the present invention comprises: a beam splitter, which has a first region and a second region; and a filter, which reduces the transmittance of the second region. The first region includes a beam splitting surface that reflects part of incident light and transmits the other part of the incident light toward the light-receiving element, and the second region transmits incident light other than the incident light to the first region.

A beam splitter as another aspect of the present invention comprises a first region, a second region, and a filter, which reduces the transmittance of the second region. The first region includes a beam splitting surface that reflects part of incident light and transmits the other part of the incident light toward the light-receiving element, and the second region transmits incident light other than the incident light to the first region.

Other objects and further features of the present invention will become readily apparent from the following description of the preferred embodiments with reference to accompanying drawings.

DETAILED DESCRIPTION OF THE PREFERRED EMBODIMENTS

The preferred embodiments of the present invention will be described below with reference to the drawings.

Embodiment 1

FIGS. 1 to 25 are figures relating a digital color camera (optical apparatus) of Embodiment 1 of the present invention.

Figure 1:
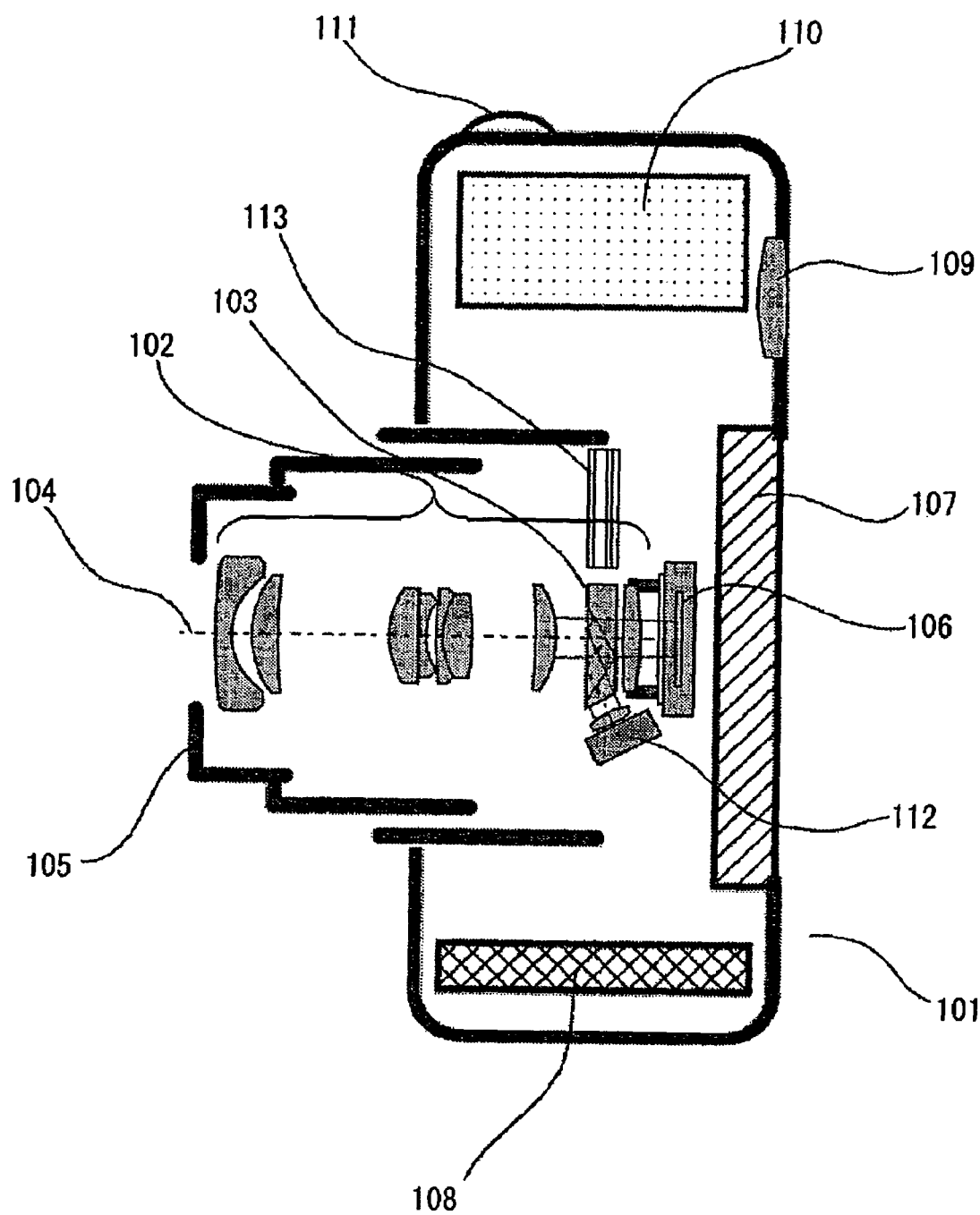
FIG. 1 is a sectional view showing the digital color camera of Embodiment 1 of the present invention.

First, FIG. 1 is a sectional view showing a state in which the focus detection is performed and an image for EVF (Electric Viewfinder) is taken. In FIG. 1, Reference numeral 101 denotes a digital color camera body, 102 an image-forming optical system, 104 the optical axis of the image-forming optical system 102, and 105 a lens barrel housing the image-forming optical system 102. The image-forming position of the image-forming optical system 102 can be adjusted in the direction of the optical axis 104 by a driving source and driving mechanism, not shown in the figure. Focusing on an object may be performed by changing the interface shape and the refractive index of a focus lens made of a transparent elastic member having flexibility or constituted by a liquid lens. The image-forming optical system 102 may be constituted by a single lens, a zoom lens, a shift lens or the like. In addition, the image-forming optical system 102 may be interchanged between ones having various characteristics such as F-numbers or focus lengths.

If a composite material in which niobium oxide particles having a diameter of 5 nm to 30 nm are dispersed uniformly in acrylate resin is used as the material of a lens constituting the image-forming optical system 102, it is possible to manufacture the lens that is stronger against impacts than glass while its refractive index is high, which is approximately 1.8, inexpensively by injection molding.

Reference numeral 103 denotes a beam splitter, 111 a shutter release button, 107 a display unit, 108 a memory card storing image data, 109 an eyepiece lens of an optical viewfinder, 110 a wireless communication unit communicating data with a printer, etc., 106 a two-dimensional CMOS light-receiving sensor, 112 a focus detection sensor, and 113 an optical low-pass filter.

Figure 25:
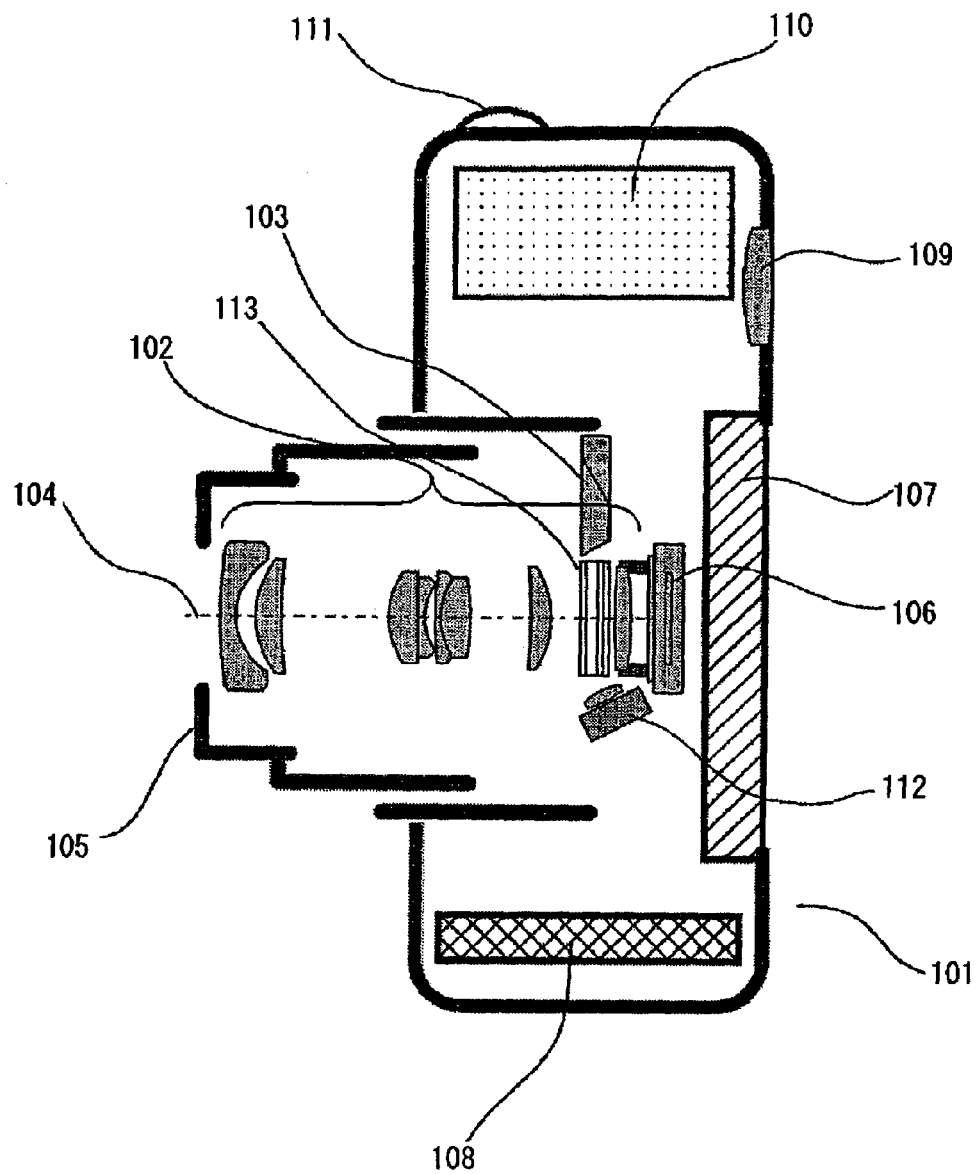
FIG. 25 is a figure showing a state in which the optical low-pass filter 113 and the beam splitter 103 were interchanged in the digital color camera shown in FIG. 1.

The beam splitter 103 and the optical low-pass filter 113 are moved by a driving mechanism, not shown in the figure. The optical low-pass filter 113 is inserted into the position where the beam splitter 103 was provided so as to replace the beam splitter 103 by it when taking a high-definition image, as shown in FIG. 25. In other words, a luminous flux transmitted through the beam splitter 103 reaches the CMOS light-receiving sensor 106 when taking an image for EVF, and a luminous flux transmitted through the optical low-pass filter 113 reaches the CMOS light-receiving sensor 106 when taking a high-definition image.

The display unit 107 is provided on the back of the camera body 101, and the object image taken by the CMOS light-receiving sensor 106 is displayed on the display unit 107. The user can observe the object image directly as an EVF image. If an organic EL spatial modulating element, a liquid crystal spatial modulating element, a spatial modulating element using electrophoresis of fine particles or the like is used, a low-power and low-profile display unit 107 can be achieved. This is convenient for a display unit provided to the camera.

The CMOS light-receiving sensor 106 (hereinafter, it is abbreviated as the CMOS sensor) is a CMOS process compatible sensor, which is one of amplified solid-state image-pickup elements. The CMOS sensor has the advantage that the number of masks and manufacturing processes can be considerably reduced in comparison with a CCD because MOS transistors in an area sensor portion and a peripheral circuitry including a image-pickup element driving circuit, AD converting circuit and image processing circuit are formed in the same process.

Furthermore, the CMOS sensor also has the advantage that it is possible to access randomly to any pixel. Thereby, real-time display can be performed with a high display rate by thinning the pixels that are read out.

The CMOS sensor 106 performs, by using this advantage, an EVF image output operation in which the pixels read out are thinned and a high-definition image output operation in which all pixels are read out.

Figure 2:
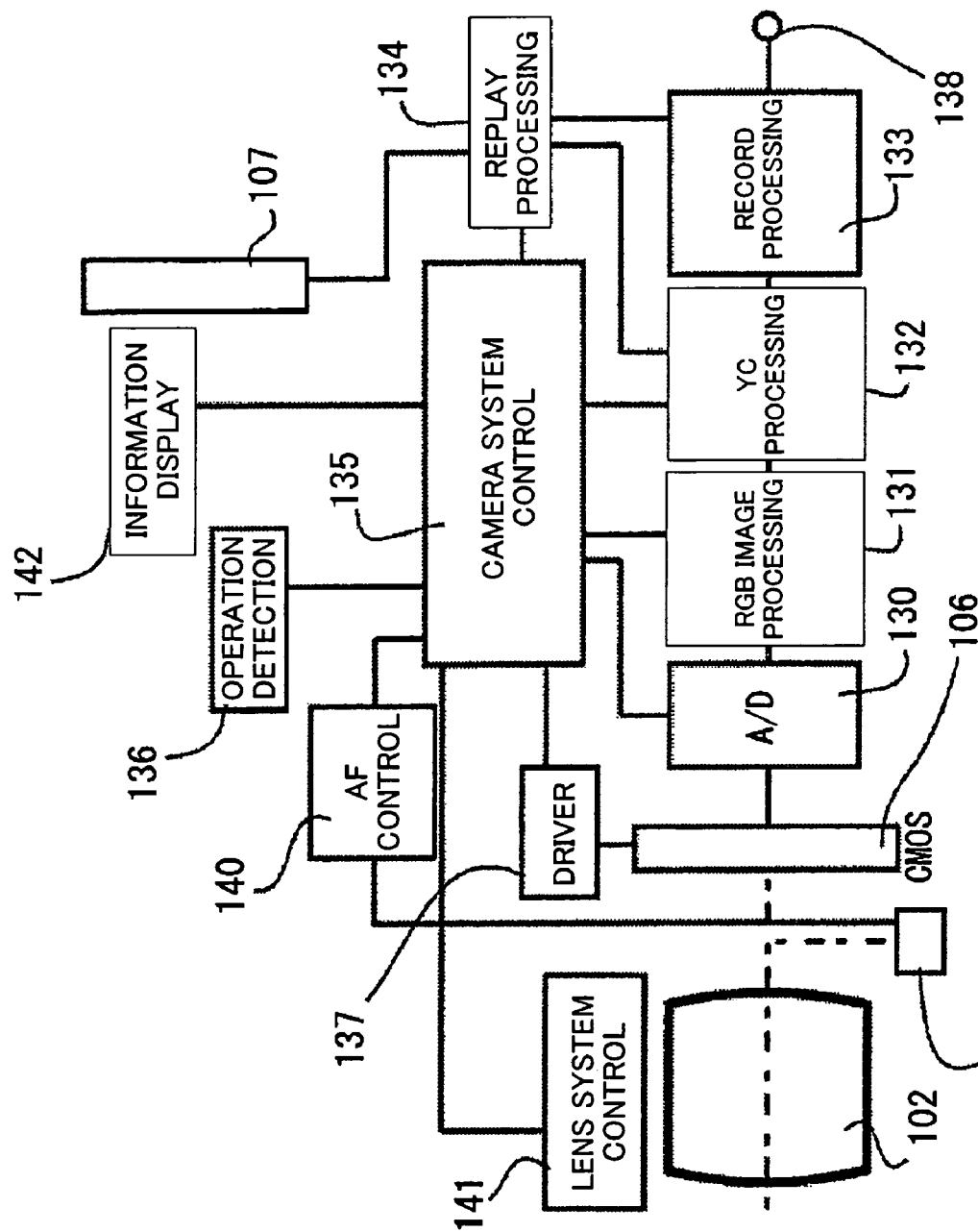
FIG. 2 is a block diagram showing the electrical structure of the digital color camera shown in FIG. 1.

FIG. 2 is a block diagram showing the electrical structure of the digital color camera. First, the description about image-taking of an object image and recording the taken image. The camera has an image-taking system, an image processing system, a recording/replaying system and a control system. The image-taking system includes the image-taking optical system 102 and the CMOS sensor 106. The image processing system includes an A/D converter 130, a RGB image processing circuit 131 and a YC processing circuit 132. The recording/replaying system includes a record processing circuit 133 and a replay processing circuit 134. The control system includes a camera system control circuit 135, an operation detection circuit 136 and a CMOS sensor driving circuit 137. Reference numeral 138 denotes a connecting terminal standardized for sending and receiving data by connecting to an external computer or the like. These electrical circuits are driven by a small fuel cell, not shown in the figure.

The image-taking system is an optical processing system, which makes light from an object form an image on the CMOS sensor 106 through the image-forming optical system 102. The image-taking system exposes the CMOS sensor 106 with the object light having an appropriate light amount by adjusting an aperture diaphragm and mechanical shutter, not shown in the figure. A light-receiving element having about ten million pixels, in which three thousand and seven hundred square pixels are arranged along the long side and two thousand and eight hundred square pixels are arranged along the short side is used as the CMOS sensor 106. R(red), G(green) and B(blue) color filters are alternately arranged for each pixel, and Bayer arrangement, in which four pixels becomes a group, is formed.

In Bayer arrangement, the number of the G pixels, to which an observer is more sensitive when he/she observes an image, is larger than that of the R and B pixels. Thereby, total image performance is increased. In general, in the image processing for the image-pickup element of this method, most luminance signals are generated from G, and color signals are generated from R, G and B.

The image signals read out from the CMOS sensor 106 is provided to the image processing system via the A/D converter 130. The A/D converter 130 is a signal converting circuit, which converts the signal from each exposed pixel into a digital signal (for example, 12 bit signal) according to its amplitude, and outputs the digital signal. The subsequent processing is performed by digital processing.

The image processing system is a signal processing circuit, which obtains desired format image signals from the R, G and B digital signals. The image processing system converts the R, G and B color signals into a luminance signal Y, a YC signal expressed by color difference signals (R-Y) and (B-Y), or the like.

The RGB image processing circuit 131 is a signal processing circuit, which processes the image signals of the 3,700×2,800 pixels received from the CMOS sensor 106 via the A/D converter 130. The RGB image processing circuit 131 has a white balance circuit, a gamma correction circuit and an interpolation calculation circuit that generates a high-resolution image by interpolation calculation.

The YC processing circuit 132 is a signal processing circuit, which generates the luminance signal Y and the color difference signals R-Y and B-Y. The YC processing circuit 132 is constituted by a high-frequency luminance signal generating circuit that generates a high-frequency luminance signal YH, a low-frequency luminance signal generating circuit that generates a low-frequency luminance signal YL and a color difference signal generating circuit that generates the color difference signals R-Y and B-Y. The luminance signal Y is generated by combining the high-frequency luminance signal YH and the low-frequency luminance signal YL.

The recording/replaying system is a processing system, which outputs the image signal to a memory and outputs the image signal to the display unit 107. The record processing circuit 133 writes the image signal to the memory and reads out the image signal therefrom, and the replay processing circuit 134 replays the image signal that has read out from the memory and outputs it to the display unit 107.

Further, the record processing circuit 133 internally has a compressing/decompressing circuit, which compresses the YC signal expressing a still image and moving image in a predetermined compression format, and decompresses the compressed data at the time of readout. The compressing/decompressing circuit includes a frame memory for signal processing, or the like. The compressing/decompressing circuit accumulates the YC signal from the image processing system image by image, reads out the YC signal of each image block by block, and compresses and encodes it. The compression and encoding are performed by two-dimensional orthogonal transformation, normalization and Huffman encoding of the image signal of each block, for example.

The replay processing circuit 134 is a circuit, which performs matrix transformation of the luminance signal Y and the color difference signals R-Y and B-Y to convert them into RGB signals, for example. The signals converted by the replay processing circuit 134 are output to the display unit 107, and a visible image is replayed and displayed. The connection between the replay processing circuit 134 and the display unit 107 or between the replay processing circuit 134 and a printer may be made by a wireless communication means such as Bluetooth. Thereby, it becomes possible to monitor the image taken by the digital camera at a point distant therefrom, and to print out the taken image without a personal computer.

The control system includes the operation detection circuit 136 that detects the operation of operating members such as the shutter release button 111; the camera system control circuit 135 that controls each part in accordance with the detection signal, and generates and outputs signals such as a timing signal for image-taking; the CMOS sensor driving circuit 137 that generates a driving signal for driving the CMOS sensor 106 under the control of the camera system control circuit 135; and an information displaying circuit 142 that controls an inner information display unit provided in the optical viewfinder and an external information display unit provided on the external surface of the camera.

The control system controls the image-taking system, image processing system and recording/replaying system, respectively. For example, the control system controls the drive of the CMOS sensor 106, the operation of the RGB image processing circuit 131 and the compression operation of the record processing circuit 133, and controls a state of each segment of the information display unit that displays information in the optical viewfinder or the like according to the operation of the information displaying circuit 142.

Further, an AF control circuit 140 and a lens system control circuit 141 are connected to the camera system control circuit 135. These circuits mutually communicate data required for respective processes around the camera system control circuit 135.

The AF control circuit 140 generates a focus detection signal by obtaining an output signal from a focus detection field of the focus detection sensor 112, which is set in accordance with a predetermined position in the image-taking screen, and detects the image-forming state of the image-forming optical system 102. When defocusing is detected, the AF control circuit 140 converts the defocus amount into the driving amount of a focus lens, which is a constituent of the image-forming optical system 102, and sends it to the lens system control circuit 141 via the camera system control circuit 135.

In addition, for a moving object, the AF control circuit 140 calculates an adequate lens position in consideration of a time lag between the push operation of the shutter release button 111 and the start of the actual image-taking control, and indicates the driving amount of the focus lens. When it is determined that sufficient focus detection accuracy is not obtained because the luminance of the object is low, the AF control circuit 140 makes a flash unit, a white LED or fluorescent tube, not shown in the figure, illuminate the object, and thereby compensating the deficient luminance.

The lens system control circuit 141 drives the focus lens in the image-forming optical system 102 in the optical axis direction via the driving mechanism, not shown in the figure, by receiving the driving amount of the focus lens, and focuses on the object.

As the result of a sequence of focusing, when the AF control circuit 140 detects an in-focus state, this information is sent to the camera system control circuit 135.

At this time, if the shutter release button 111 is pushed down to the second step, the beam splitter 103 and the optical low-pass filter 113 are counterchanged by a mechanism, not shown in the figure, and the luminous flux transmitted through the optical low-pass filter 113 forms a high-definition image. After that, the image-taking control by the image-taking system, image processing system and recording/replaying system is performed, as described above. At this time, a focus correction is not required because the optical low-pass filter 113 is inserted at the position where the beam splitter 103 has been located so that no focus change of the image-forming optical system 102 may occur. Therefore, it is possible to shorten the release time lag without hindering a rapid focus detection operation.

Figure 3:
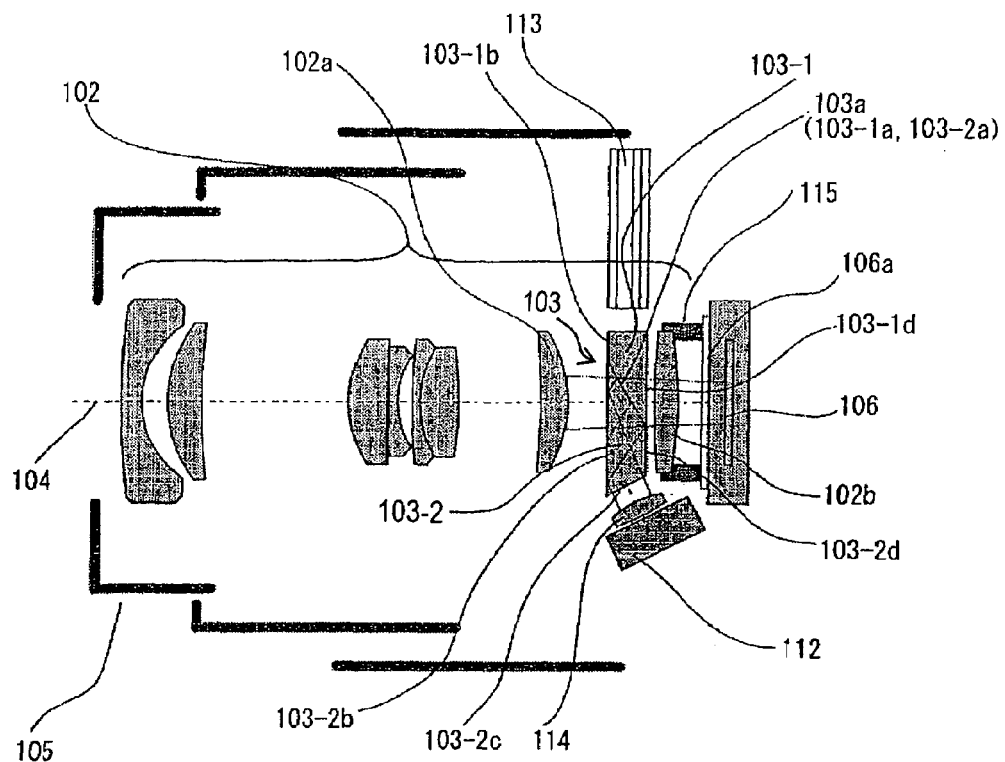
FIG. 3 is a sectional view showing the lens barrel portion of the digital color camera shown in FIG. 1.
Figure 4:
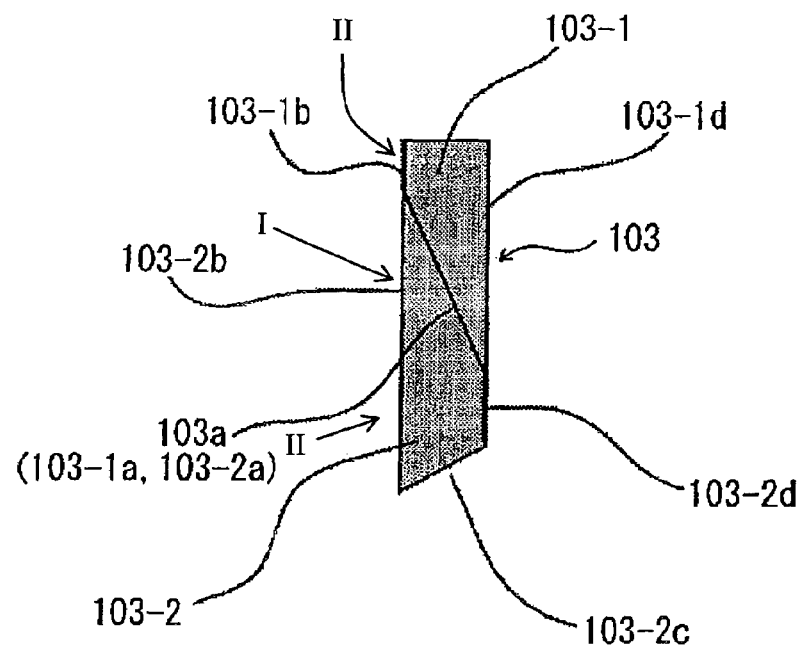
FIG. 4 is a sectional view of a beam splitter provided in the digital color camera shown in FIG. 1.
Figure 5:
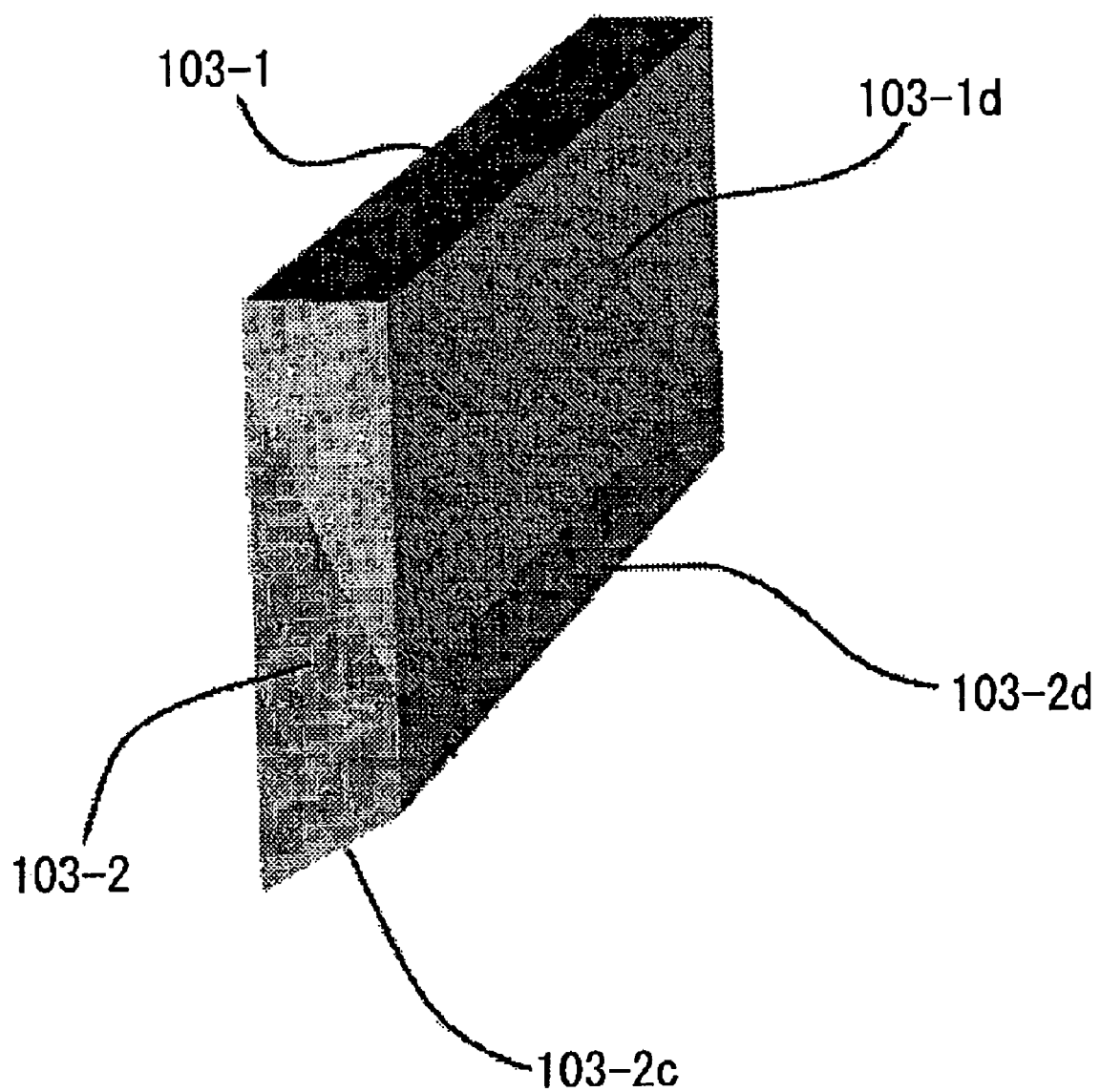
FIG. 5 is a perspective view of the beam splitter provided in the digital color camera shown in FIG. 1.
Figure 6:
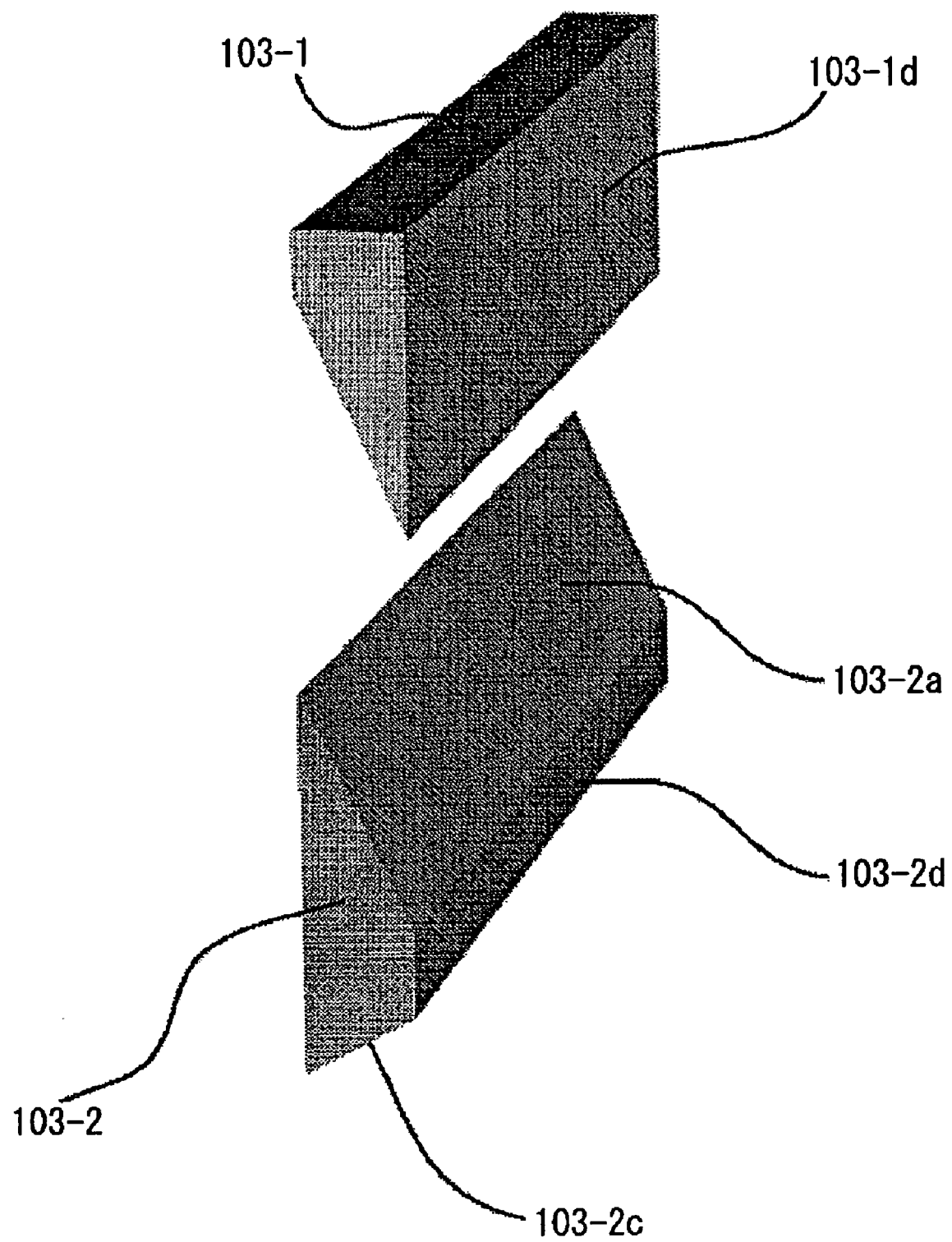
FIG. 6 is an exploded perspective view of the beam splitter provided in the digital color camera shown in FIG. 1.

FIG. 3 is a sectional view showing the portion of the lens barrel 105 of the digital color camera 101, FIG. 4 is a sectional view of the beam splitter 103, FIG. 5 is a perspective view of the beam splitter 103, and FIG. 6 is an exploded perspective view of the beam splitter 103. The detail of the beam splitter 103 and its peripheral portion will be explained using these figures.

The beam splitter 103 is located between lenses 102a and 102b, which constitute the image-forming optical system 102. The lens 102a is the focus lens, which moves in the direction of the optical axis 104 to perform focusing.

The CMOS sensor 106 is positioned with respect to the lens 102b, and its cover glass 106a is fixed to the lens 102b via a sealing member 115. By adopting such a structure, there is no possibility that dust adheres on the cover glass 106a of the CMOS sensor 106. If there is a possibility of adhesion of dust, the dust will adhere on the incidence surface of the lens 102b. There is little possibility that the dust adhering on the incidence surface of the lens 102b appears in the image-taking screen because the distance between the dust and the light-receiving surface of the CMOS sensor 106 is sufficiently long.

The optical length of the beam splitter 103 corresponds with that of the optical low-pass filter 113 in the visible wavelength region. Therefore, when the beam splitter 103 retracted from the position shown in FIG. 3 and the optical low-pass filter 113 is inserted to the position, the image-forming state of the image-forming optical system 102 on the CMOS sensor 106 does not change.

The outline of the image-taking sequence is as follows. When the first step push operation of the shutter release button 111 is detected, the CMOS sensor 106 is driven to take repeatedly the object image formed by the luminous flux transmitted through the beam splitter 103, and the real-time display of the taken object image is performed as the operation of the EVF (it is the state shown in FIG. 1). Further, the focus detection using the luminous flux divided by the beam splitter 103 is performed. If a defocus amount more than a predetermined amount is detected, the driving amount of the focus lens 102a is calculated, and the focus lens 102a is driven by the calculated driving amount for focusing. If the defocus amount within a predetermined range is confirmed, the in-focus state is noticed to the user with sound or light.

When the second step push operation of the shutter release button 111 is detected, the beam splitter 103 is retracted from the optical path of the image-forming optical system 102 by the mechanism, not shown in the figure, and the optical low-pass filter 113 is inserted instead (it is the state shown in FIG. 25). And then, the high-definition image-taking is performed by driving the CMOS sensor 106. After that, the optical low-pass filter 113 is retracted from the optical path of the image-forming optical system 102, and the beam splitter 103 is returned to the initial position (it is the state shown in FIG. 1) The taken image data on the object is written into the memory.

Next, the detail of the beam splitting function will be explained using FIGS. 3 to 6. The beam splitter 103 is formed by cementing the two prisms 103-1 and 103-2 at the beam splitting function surface 103a. The incidence surface of the beam splitter 103 is constituted by a surface 103-1b of the prism 103-1 and a surface 103-2b of the prism 103-2, and the emergence surface for the straight-advancing light is constituted by a surface 103-1d of the prism 103-1 and a surface 103-2d of the prism 103-2. There is no step between the surface 103-1b of the prism 103-1 and the surface 103-2b of the prism 103-2, and between the surface 103-1d of the prism 103-1 and the surface 103-2d of the prism 103-2. Further, the surface 103-1b of the prism 103-1 is parallel to the surface 103-1d of the prism 103-1, and the surface 103-2b of the prism 103-2 is parallel to the surface 103-2d of the prism 103-2. Therefore, the beam splitter 103 functions as a parallel plate for the straight-advancing light.

The beam splitting function surface 103a (103-1a) inclines with respect to the surface 103-1b of the prism 103-1, and the beam splitting function surface 103a (103-2a) inclines with respect to the surface 103-2d of the prism 103-2. The surface 103-1b of the prism 103-1 and the surface 103-2d of the prism 103-2 contact with the beam splitting function surface 103a so as to form an obtuse angle, respectively.

The beam splitting function surface 103a of the beam splitter 103 is formed by forming a dielectric multilayer film on the surface 103-2a of the prism 103-2 for obtaining desired optical characteristics, and by bonding the prism 103-2 to the prism 103-1 using an index matching optical adhesive.

Figure 7:
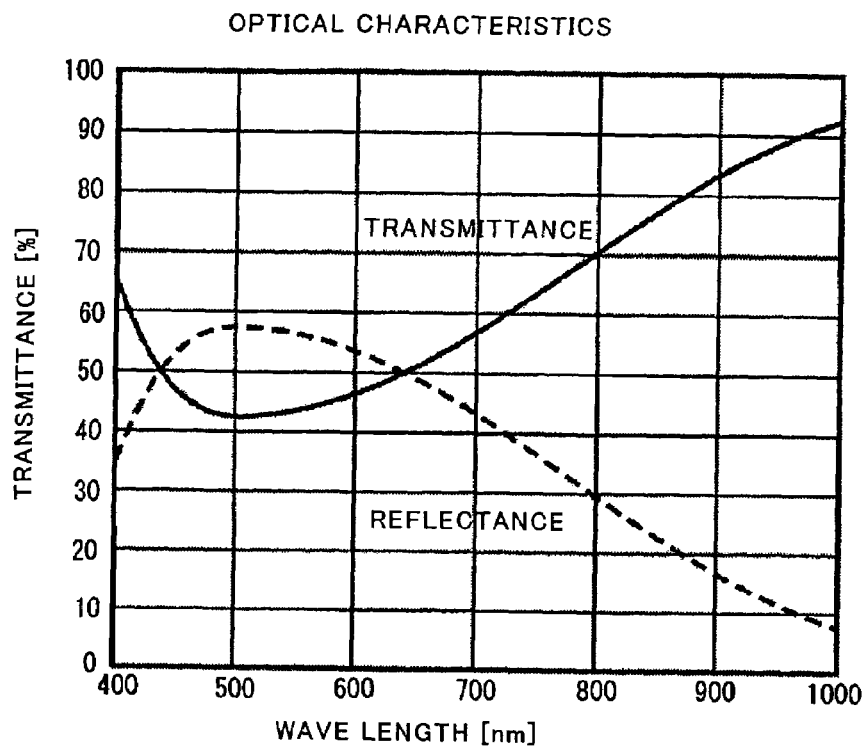
FIG. 7 is a chart showing the optical characteristics of the beam splitting function surface 103a provided in the digital color camera shown in FIG. 1.

The characteristics of the beam splitting function surface 103a are as shown in FIG. 7. The spectral transmittance characteristic in the wavelength region from 400 nm to 1,000 nm has a valley shape that has the minimum value near 500 nm. On the other hand, the spectral reflectance characteristic in the same wavelength region has a mountain shape that has the maximum value near 500 nm. In other words, the beam splitting function surface 103a reflects a part of the incident light of a predetermined wavelength region, and transmits another part thereof. Since the dielectric multilayer film has a feature that it can make absorption of light vanishingly small, the incident light separates either in the direction toward the CMOS sensor or in the direction toward the focus detection sensor at the beam splitting function surface 103a.

Here, the spectral transmittance characteristic is approximately 45% in the visible wavelength region from 450 nm to 650 nm. Since the sensitivity wavelength region of the CMOS sensor 106 corresponds to the visual sensitivity region in the color camera, the spectral transmittance characteristic is flat in the sensitivity wavelength region of the CMOS sensor 106.

The luminous flux reflected by the beam splitting function surface 103a, of the luminous flux that entered the beam splitter 103 from the incidence surface constituted by the surface 103-1b of the prism 103-1 and the surface 103-2b of the prism 103-2, is totally reflected by the surface 103-2b, and then emerged from a surface 103-2c of the prism 103-2. A condenser lens 114, which condenses the luminous flux used for focus detection, is disposed at the position facing the surface 103-2c. The luminous flux that has passed through the condenser lens 114 enters the focus detection sensor 112. Thereby, the focus detection function operates.

Thus, the spectral characteristic (spectral reflectance characteristic) for the luminous flux divided by the beam splitter 103 is substantially the same as the spectral characteristic (spectral transmittance characteristic) for the straight-advancing light in contrast with the art described in Patent Document 1, and the focus detection function operates using the divided luminous flux. Since the spectral reflectance characteristic is approximately 55% in this embodiment, it is possible to perform highly accurate focus detection using a sufficient amount of light.

Further, it is preferable to add an infrared cutting function to the condenser lens 114 for matching the spectral sensitivity of the focus detection sensor 112 and that of the CMOS sensor 106 strictly.

A ND filter (Neutral Density filter) is formed on the surface 103-1b of the prism 103-1 and the surface 103-2d of the prism 103-2. The ND filter is a kind of light absorbing film. The ND filter is made of an evaporated film such as chromel, and has a flat transmittance characteristic for a very wide wavelength region. Chromel is an alloy mainly composed of nickel (Ni) with 7.0 to 10.5% of Cr, 1.5% or less of Mn, and 1.0% or less of Si.

Figure 8:
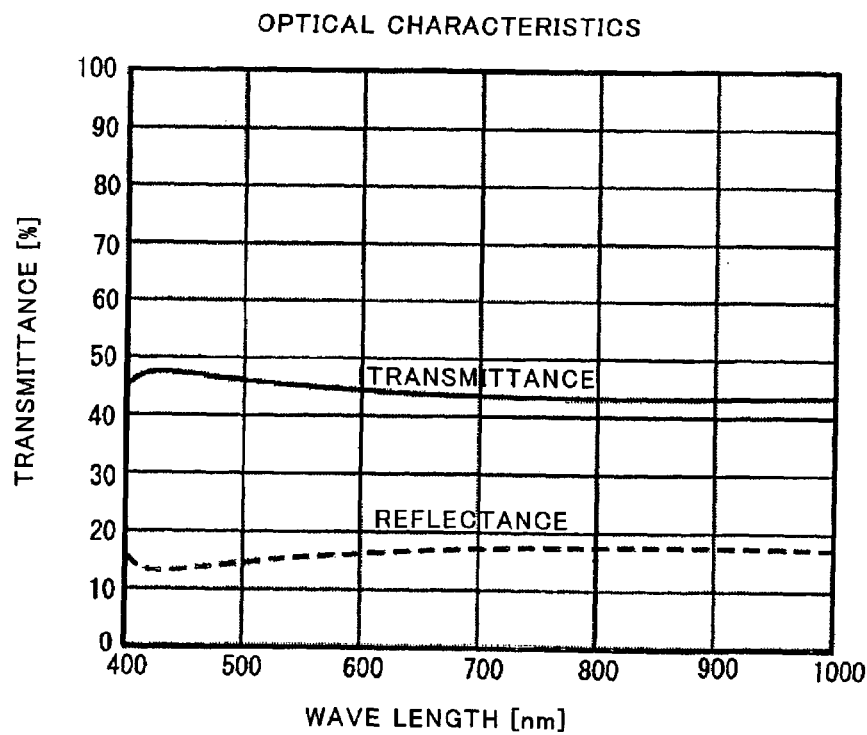
FIG. 8 is a chart showing the optical characteristics of the ND filter provided in the digital color camera shown in FIG. 1.

FIG. 8 shows an example of the optical characteristics of the ND filter made of chromel. The spectral transmittance is approximately 45% in the visible wavelength region from 450 nm to 650 nm. The spectral reflectance is approximately 15% in the same region because the absorption of light is large.

Figure 9:
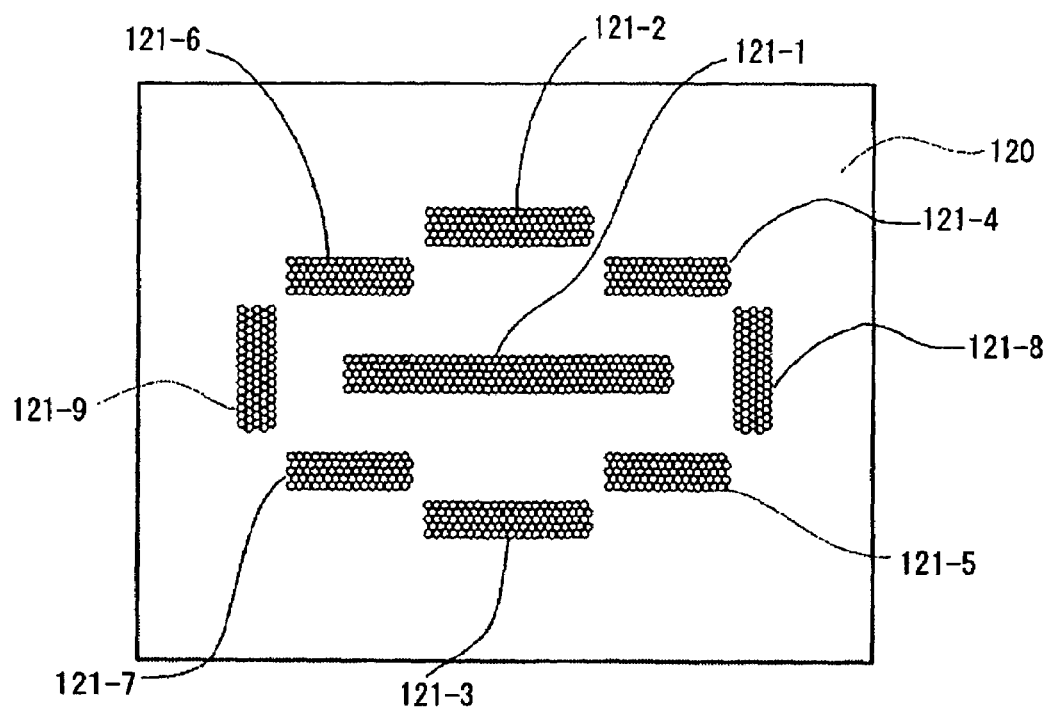
FIG. 9 is a figure showing the focus detection field of the focus detection sensor 112 provided in the digital color camera shown in FIG. 1.

Next, the description of the focus detection sensor 112 will be given. FIG. 9 is a figure showing the focus detection filed of the focus detection sensor 112. In FIG. 9, reference numeral 120 denotes a finder-viewing field, 121-1 to 121-9 focus detection fields. Setting the focus detection fields in the vicinity of the center of the image-taking area improves the usability of the camera.

Since the focus detection field constituted by the vertical pixel row has sensitivity to the luminance distribution in the vertical direction, it is possible to perform the focus detection for a horizontal line, for example. Since the focus detection field constituted by the horizontal pixel row has sensitivity to the luminance distribution in the horizontal direction, it is possible to perform the focus detection for a vertical line, for example.

Figure 10:
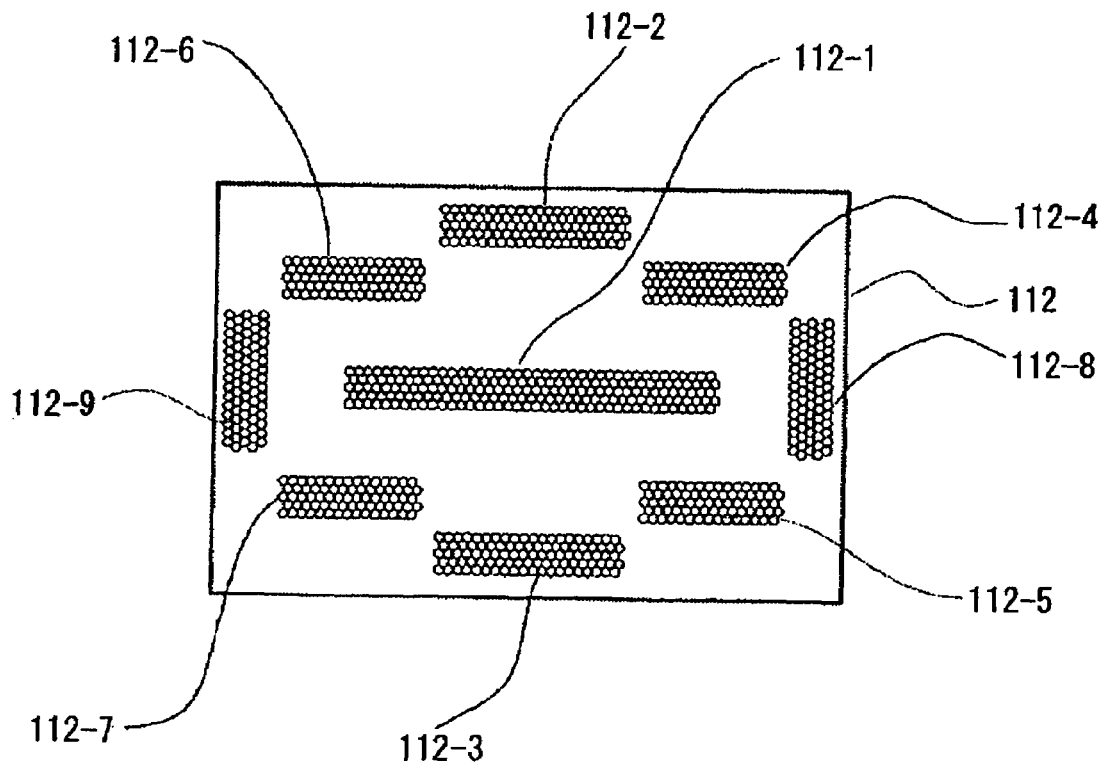
FIG. 10 is a plain view of the focus detection sensor 112 provided in the digital color camera shown in FIG. 1.

The actual focus detection sensor 112 is constituted as shown in FIG. 10. FIG. 10 is a plane view of the focus detection sensor 112. Reference numerals 112-1 to 112-9 denote pixel rows constituting the focus detection fields 121-1 to 121-9.

Figure 11:
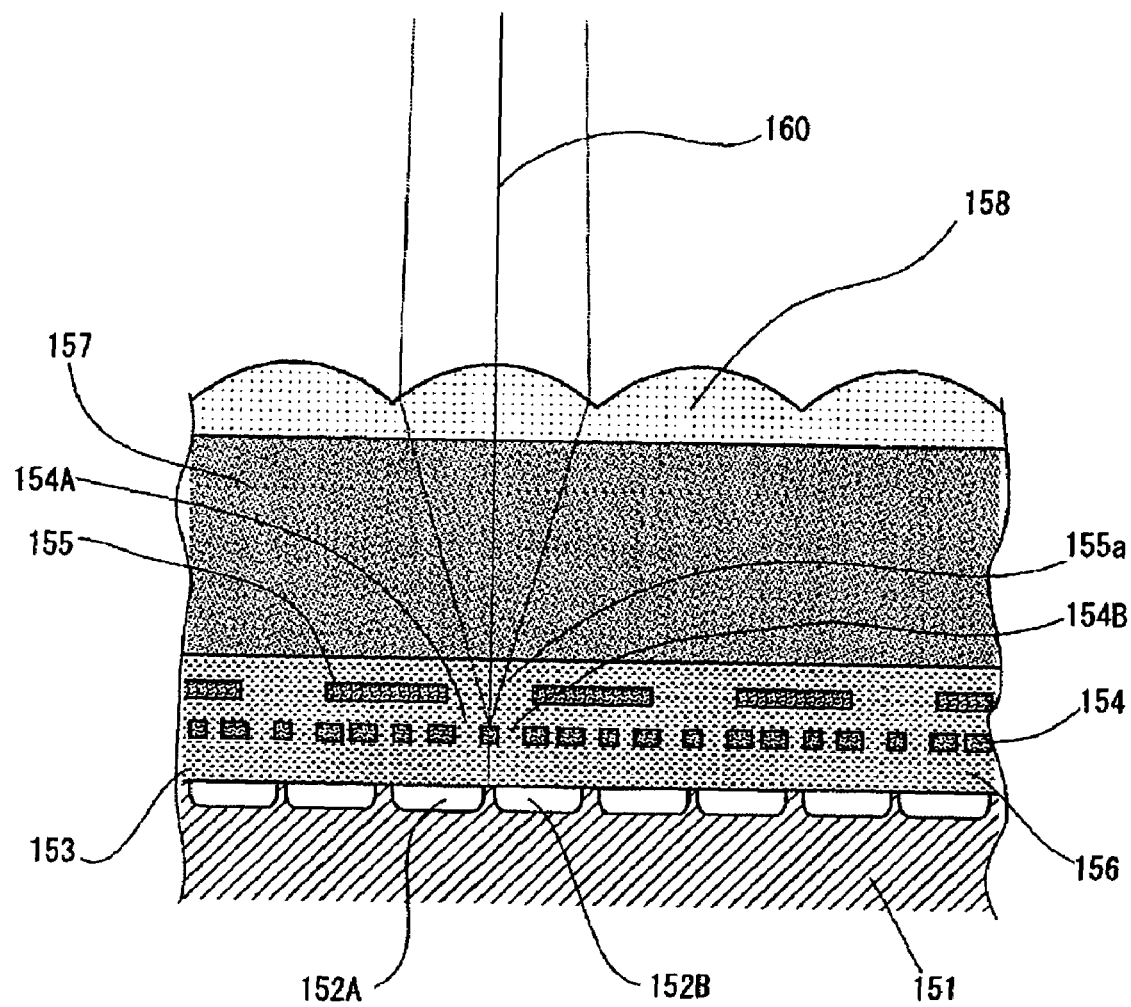
FIG. 11 is a sectional view of pixel portion of the light-receiving sensor 108 provided in the digital color camera shown in FIG. 1.
Figure 12A:
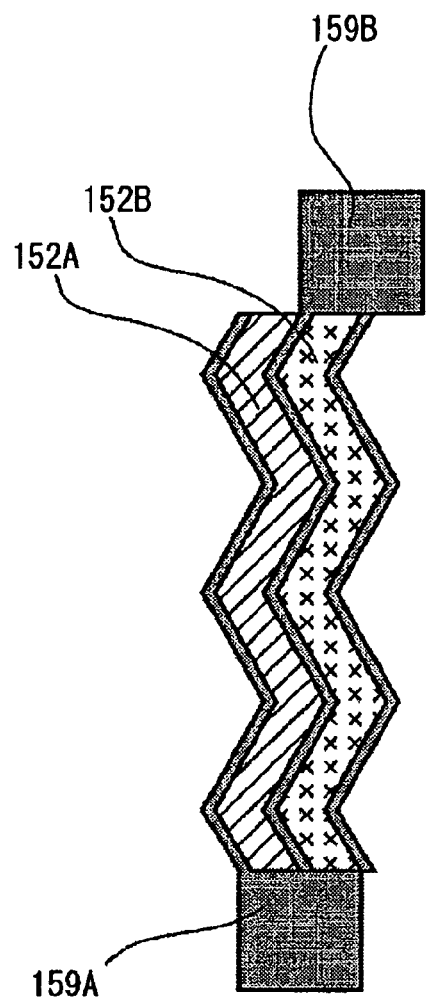
FIGS. 12A and 12B are plain views of one pixel photoelectric conversion portion and a pixel of the light-receiving sensor 108 provided in the digital color camera shown in FIG. 1.
Figure 12B:
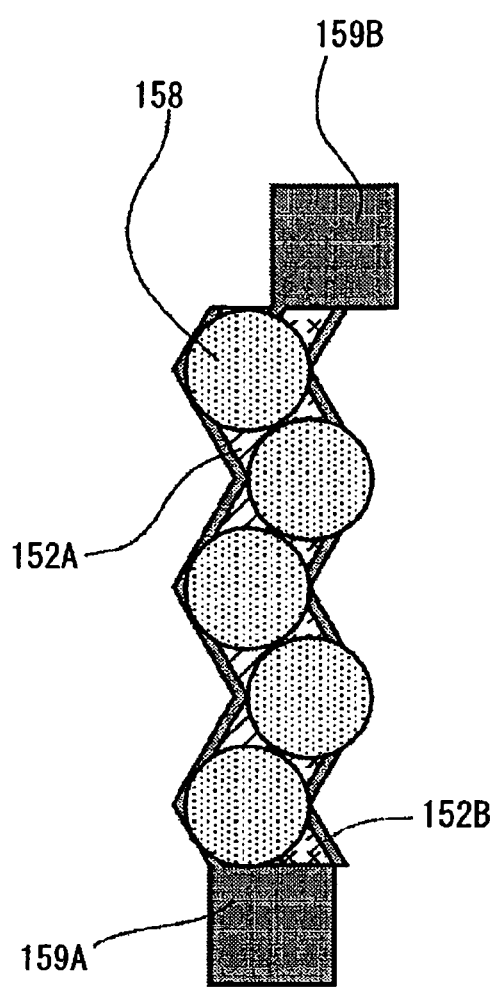

Now, the structure of the focus detection sensor 112 will be explained. FIG. 11 is a sectional view of the focus detection sensor 112, FIG. 12A is a plane view showing the photoelectric conversion portion of a pixel in the focus detection sensor 112, and FIG. 12B is a plane view showing the micro lens of a pixel in the focus detection sensor 112. Light enters the focus detection sensor 112 from above in FIG. 11, and the light enters the focus detection sensor 112 from the front of the paper in FIGS. 12A and 12B. The focus detection sensor 112 is a CMOS sensor including on-chip micro lenses, and the F-number is determined by the action of the micro lens.

In FIG. 11, reference numeral 151 denotes a silicon substrate, 152A and 152B photoelectric conversion portions of embedded photodiodes, 154 a first wiring layer using aluminum or copper, which has light blocking effect, 155 a second wiring layer using aluminum or copper. Reference numeral 156 denotes an interlayer insulation film using a silicon dioxide film, a hydrophobic porous silica, a silicon dioxide nitride film or a silicon nitride film, and a passivation film. Reference numeral 158 denotes a micro lens, 157 a planarizing layer for setting the distance between the second wiring layer 155 and the micro lens 158 with high accuracy.

The first wiring layer 154 and the second wiring layer 155 are metal films in which openings are provided discretely. They do not transmit the visible light except the openings. The first wiring layer 154 and the second wiring layer 155 have an electrical function making the focus detection sensor 112 operate and an optical function controlling the angle characteristics of the received luminous flux. The planarizing layer 157 is formed by a technique such as curing of a heat-curable resin or an ultraviolet-curable resin after spin coating, or adhesion of a resin film.

The photoelectric conversion portions 152A and 152B have a zigzag shape as shown in FIG. 12A, and circuit portions 159A and 159B are connected to the end of the photoelectric conversion portions 152A and 152B, respectively. The circuit portions 159A and 159B include a transferring MOS transistor that acts as a transfer switch, a resetting MOS transistor that provides a reset potential, a source follower amplification MOS transistor, selecting MOS transistor that makes the source follower amplification MOS transistor output a signal selectively and the like. As shown in FIG. 12B, five micro lenses are provided for one pixel so as to form a zigzag shape above the photoelectric conversion portion 152.

The micro lens 158 is made of a material such as resin, $SiO_2$, $TiO_2$, $Si_3N_4$. The micro lens 158 is a rotational symmetric spherical lens or rotational symmetric aspherical lens because it is used for not only condensing but also image-forming. The micro lens 158 has a circular shape in the plain view because the shape has an axis of symmetry 160. However, providing a plurality of micro lenses to one pixel increases the light-receiving area of one pixel while narrowing the pitch of pixels.

Therefore, it is possible to obtain a sufficient output from the light-receiving sensor even if the object luminance is low. A lens shape having no axis of rotational symmetry such as a semicylindrical shape is not appropriate to the focus detection sensor 112 because the lens shape does not have an image-forming action. A thin film with a low refractive index or a minute structure (so-called sub-wavelength structure) whose structural period is equal to the wavelength of the visible light or less can be formed on the surface of the micro lens 158 for suppressing surface reflection.

The luminous flux emerged from the condenser lens 114 enters the micro lens 158 of the focus detection sensor 112 first, and then a component of the luminous flux, which has passed through the opening 155a formed in the second wiring layer 155 and the opening 154A formed in the first wiring layer 154, enters the photoelectric conversion portion 152A, and a component of the luminous flux, which has passed through the opening 155a formed in the second wiring layer 155 and the opening 154B formed in the first wiring layer 154, enters the photoelectric conversion portion 152B. The components are converted into electrical signals by the photoelectric conversion portions 152A and 152B, respectively. Since the first wiring layer 154 and the second wiring layer 155 are also used as a light shielding layer for forming the openings, an extra light shielding layer for forming the openings is not required. Therefore, it becomes possible to simplify the structure of the light-receiving sensor.

Figure 13:
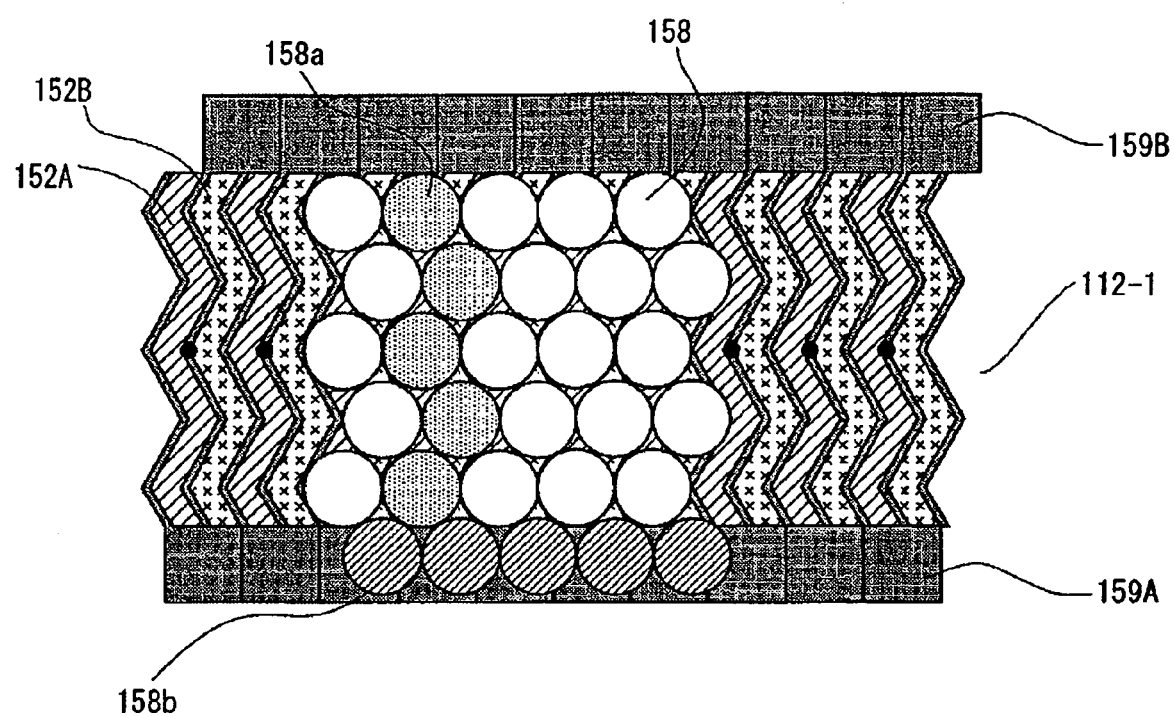
FIG. 13 is a plain view showing a state in which pixel rows for focus detection are formed by connecting pixels shown in FIG. 12.
Figure 14:
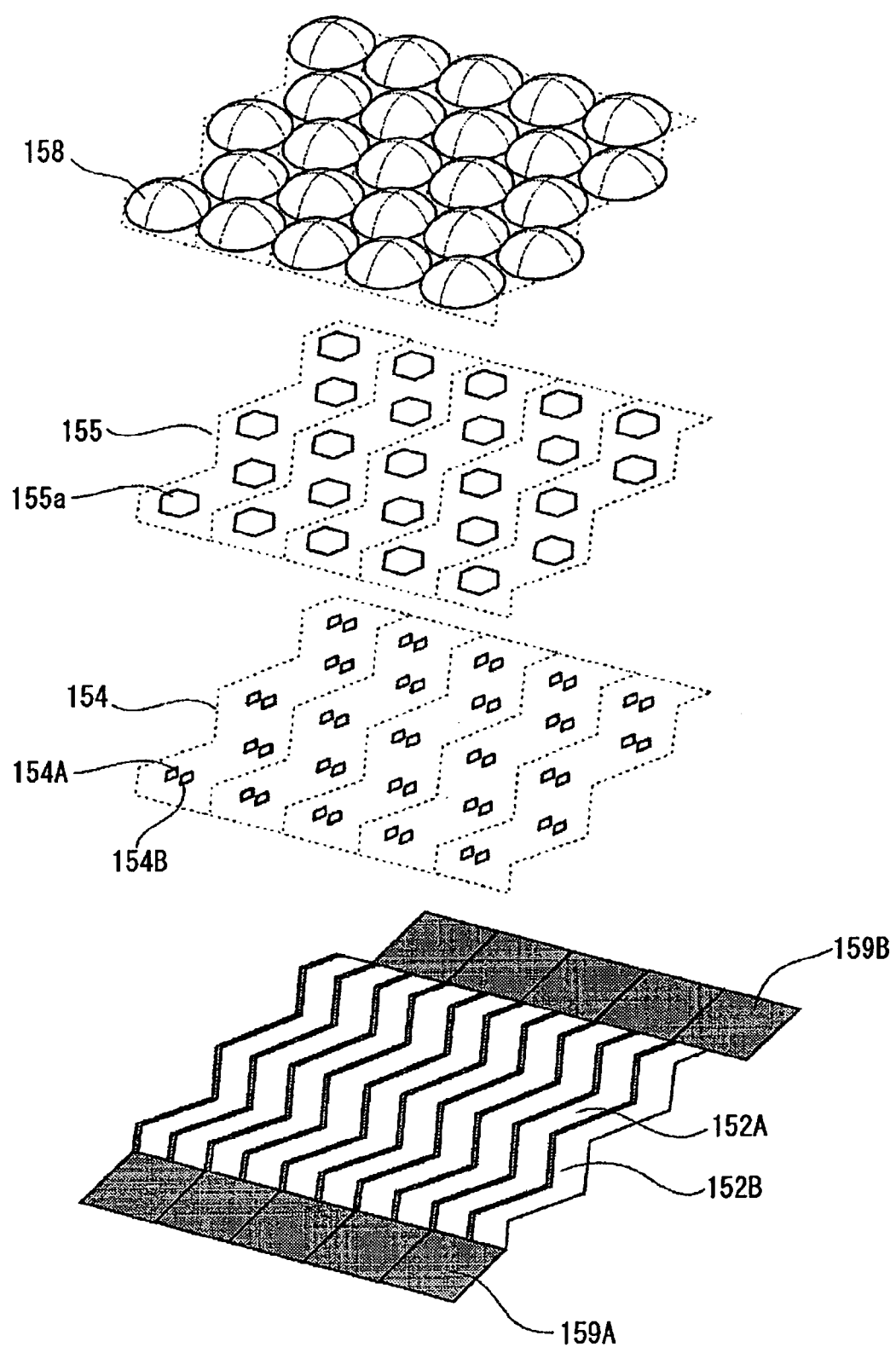
FIG. 14 is an exploded view showing the state in which the pixel rows for focus detection are formed by connecting pixels shown in FIG. 12.
Figure 15:
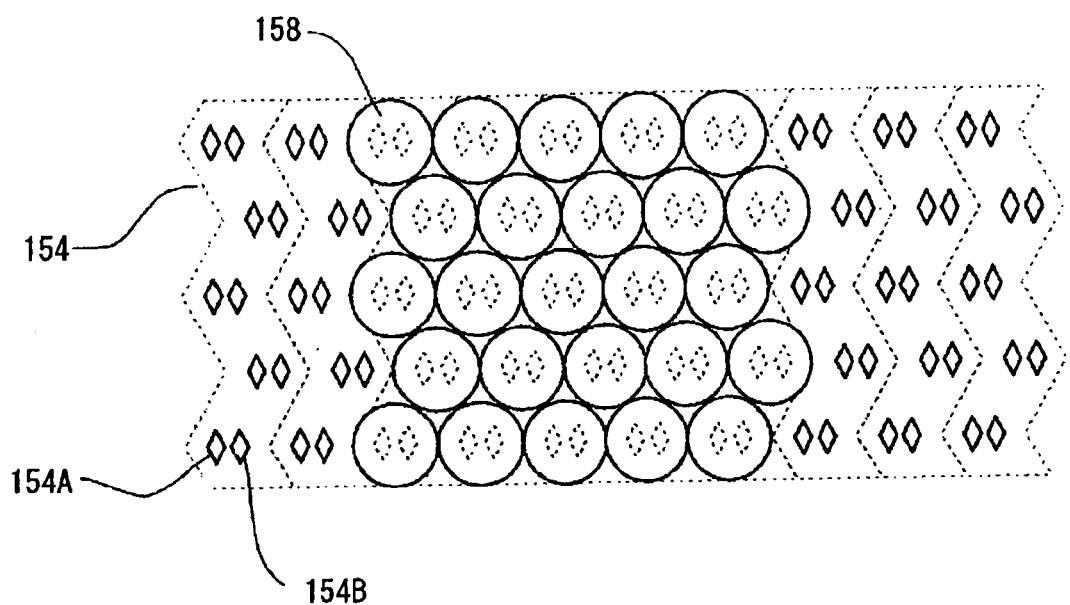
FIG. 15 is a plain view of the openings 154A and 154B of the first wiring layer 154 provided in the digital color camera shown in FIG. 1.

FIGS. 13 and 14 are a plain view and a perspective view showing a state in which the pixels shown in FIG. 12 are connected to form pixel rows used for focus detection, respectively. In FIG. 13, the micro lenses of both ends are omitted so that the relationship between the photoelectric conversion portion and the micro lens; the photoelectric conversion portion is thereby uncovered. In FIG. 14, the photoelectric conversion portion, the first wiring layer, the second wiring layer and the micro lens are extracted from the constituents and shown in a state of disassembly in the up and down direction. The zigzag shape of the photoelectric conversion portions are shown by dashed lines on the first wiring layer and the second wiring layer to make the border of each pixel understandable.

In FIG. 13, the dotted five micro lenses 158a constitutes one pixel, and a lot of pixels like this line up in the horizontal direction to form the pixel rows 112-1 to 112-9 shown in FIG. 10. Since the micro lenses forming the zigzag shape perfectly fill the space next to the micro lenses of the adjacent pixel, the micro lenses are disposed thickly on each pixel row. Therefore, an unavailable luminous flux that does not enter the micro lens is vanishingly small.

When focusing attention on the arrangement direction, the zigzag arrangement can reduce the frequency response of the pixel in the vicinity of the Nyquist frequency. Thereby, replicated distortion is hard to be generated even if an object image including a spatial frequency component, which is equal to or higher than the Nyquist frequency, is projected, and the phase difference detection between the output signal waveforms of the later-described focus detection sensor with high accuracy can be performed. Furthermore, the micro lenses, which are not disposed above the photoelectric conversion portion and do not contribute to photoelectric conversion, are formed around the pixel row. This is for the reason in manufacturing that it becomes possible to manufacture the micro lenses with high dimensional accuracy if the micro lenses are disposed thickly and uniformly.

The first wiring layer 154 shown in FIG. 14 has a lot of rhombus-shaped openings 154A and 154B. A pair of the openings 154A and 154B is provided to each micro lens 158 as shown in the plain view of FIG. 15. The openings 154A and 154B are located at the vicinity of the focus point of the micro lens 158 in the depth direction.

In such a structure, since the openings 154A and 154B are reversely projected on the exit pupil of the image-forming optical system 102 by the micro lens 158, it is possible to determine the light-receiving angle characteristic of the luminous flux taken by the pixel according to the shape of the openings 154A and 154B.

The opening 155a is an aperture stop for preventing light from entering openings other than the openings 154A and 154B of the first wiring layer 154. Therefore, only the luminous fluxes that could enter the openings 154A and 154B enter the photoelectric conversion portions 152A and 152B, respectively. The shapes of the openings 154A and 154B are the same in the pixel row forming one focus detection field for preventing nonuniformity of the output signals from the pixel row.

Figure 16:
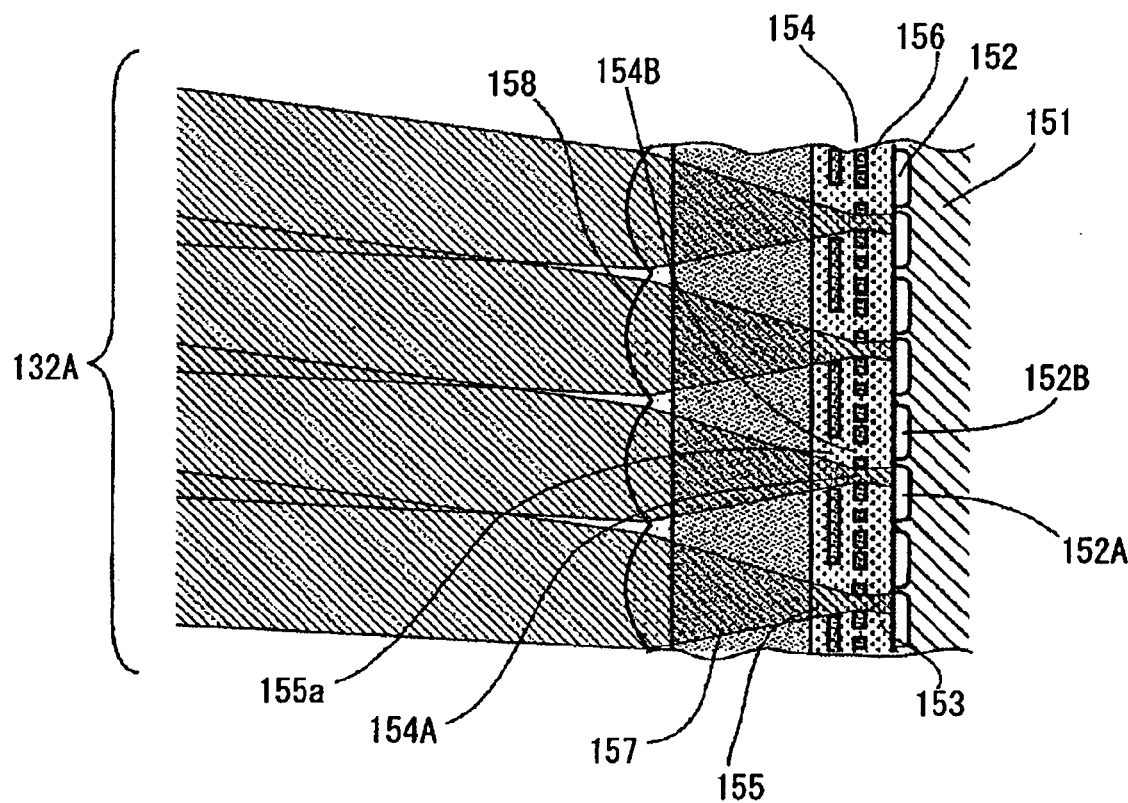
FIG. 16 is a partial sectional view of the focus detection field 112-1 shown in FIG. 10.
Figure 17:
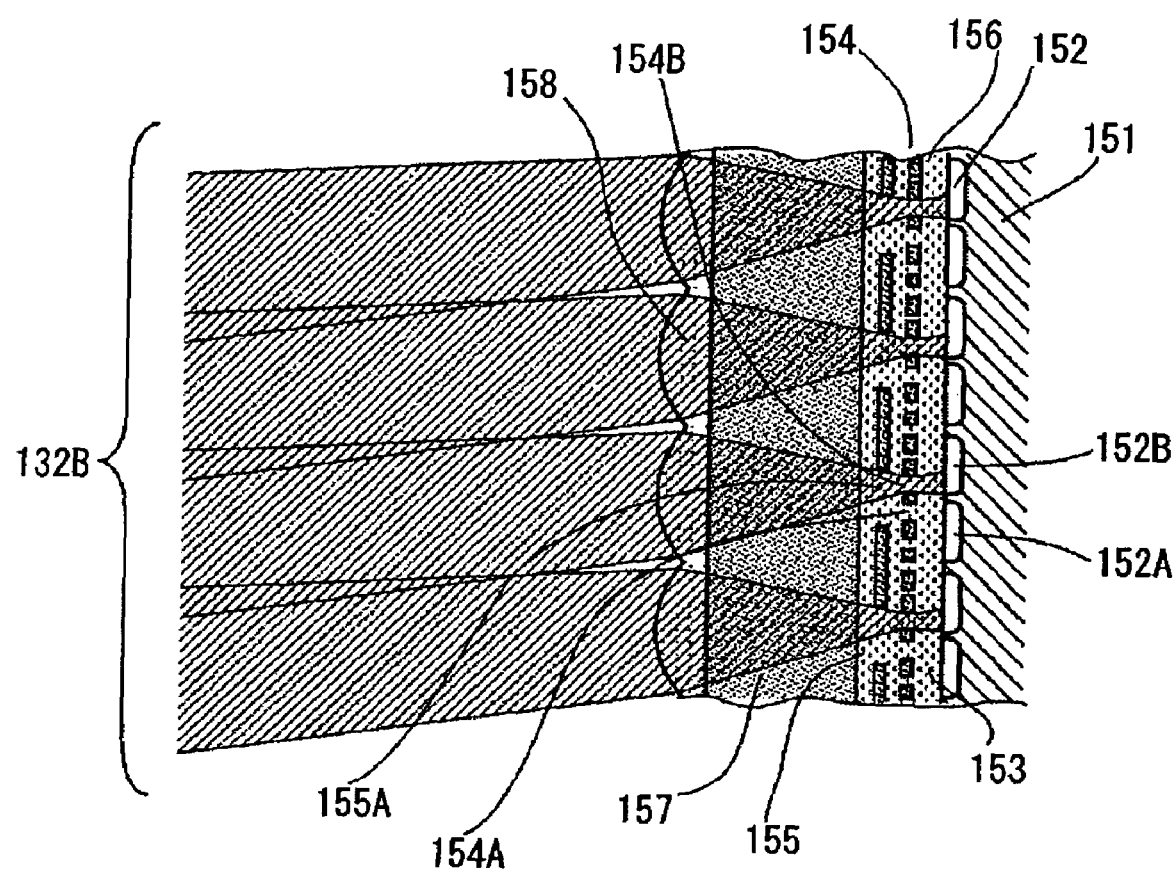
FIG. 17 is a partial sectional view of the focus detection field 112-1 shown in FIG. 10.

FIG. 16 and FIG. 17 are partial sectional views of the focus detection field 112-1 shown in FIG. 10. Since the micro lens 158 reversely projects the openings 154A and 154B of the first wiring layer 154 on the exit pupil of the image-forming optical system 102, the passage of a luminous flux 132A through the opening 154A shown in FIG. 16 is equivalent to the emergence of the luminous flux 132A from the reversely-projected image of the opening 154A. By the same token, the passage of a luminous flux 132B through the opening 154B shown in FIG. 17 is equivalent to the emergence of the luminous flux 132B from the reversely-projected image of the opening 154B. Therefore, a luminous flux entering the focus detection sensor 112 from an area other than the reversely-projected images of the openings 154A and 154B is certainly blocked by the first wiring layer 154 or the second wiring layer 155, and cannot reach the photoelectric conversion portions 152A and 152B. Thereby, the photoelectric conversion of this luminous flux is not performed.

In the pixel row constituting one focus detection field, a state in which the output signal waveform obtained by arranging the output signals from the photoelectric conversion portion 152A horizontally shifts with respect to the output signal waveform obtained by arranging the output signals from the photoelectric conversion portion 152B according to an image-forming state of the object image formed on the focus detection field by the image-forming optical system 102, is observed. This is because the areas through which the luminous flex passes on the exit pupil of the image-forming optical system 102 are different between the output signal waveform obtained by arranging the output signals from the photoelectric conversion portion 152A and the output signal waveform obtained by arranging the output signals from the photoelectric conversion portion 152B. The shift direction of the output signal waveforms is inverted in a front focus state and a rear focus state. The principle of the focus detection is the detection of this phase difference (shift amount) including the shift direction using a technique such as correlation calculation.

Figure 18:
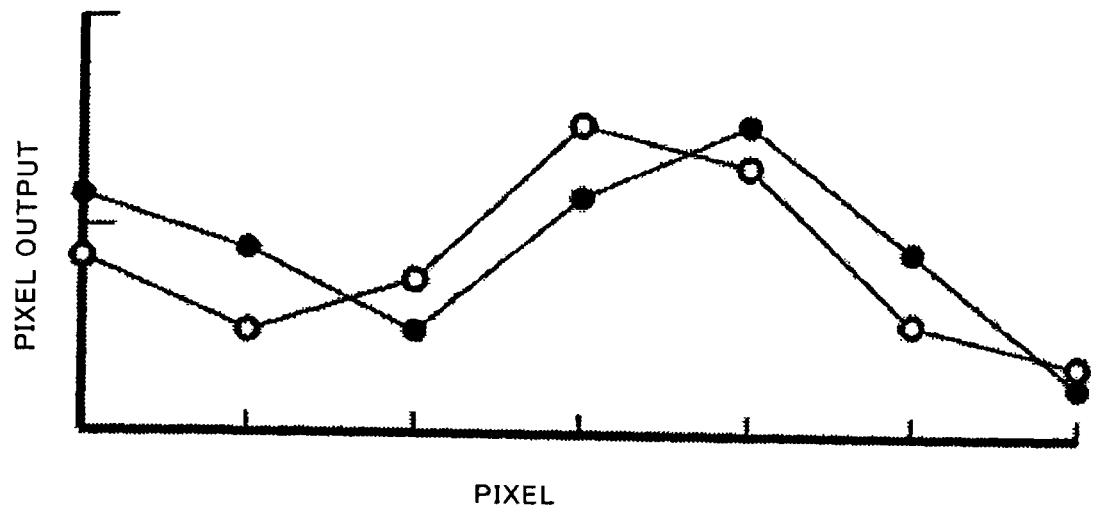
FIG. 18 is a chart showing an output signal waveform of the focus detection sensor, which is input to the AF controller 40 provided in the digital color camera shown in FIG. 1.
Figure 19:
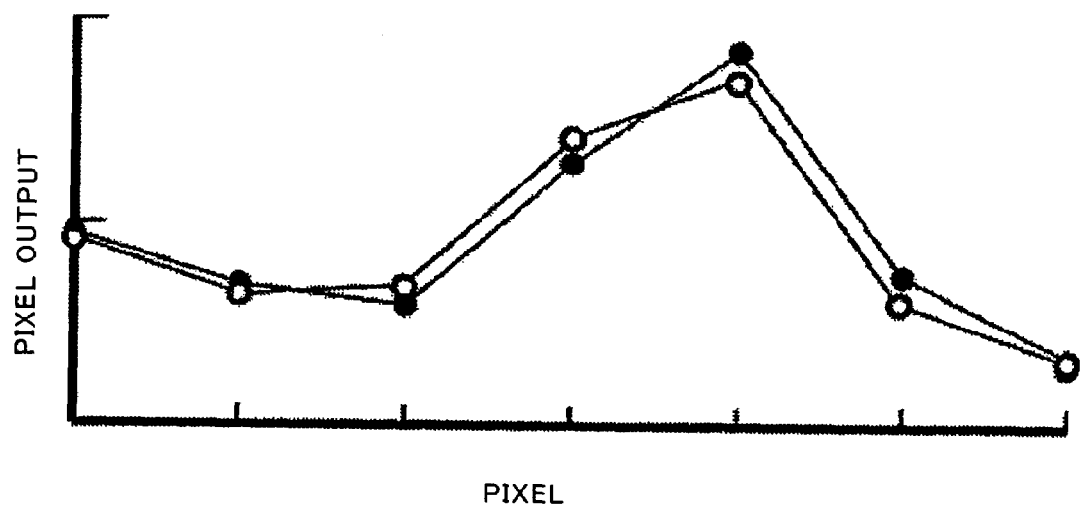
FIG. 19 is a chart showing an output signal waveform of the focus detection sensor, which is input to the AF controller 40 provided in the digital color camera shown in FIG. 1.

FIG. 18 and FIG. 19 are charts showing the output signal waveform of the focus detection sensor 112, which is input to the AF control portion 40. The horizontal axis denotes a pixel arrangement, and the vertical axis denotes the output value. FIG. 18 shows the output signal waveform in an out-of-focus state, and FIG. 19 shows the output signal waveform in an in-focus state.

Thus, it is possible to perform the focus detection by judging the coincidence of a pair of the signals, first. Further, it is possible to the defocus amount by detecting the phase difference by using a known technique using correlation calculation, such as a technique disclosed in Japanese Examined patent application No. H05-88445. Converting the obtained defocus amount into the driving amount of the focus lens in the image-forming optical system 102 makes it possible to perform automatic focusing. Since the amount to drive the focus lens is given in advance, the drive of the focus lens to the in-focus position is normally required once, and thereby performing fast focusing.

Here, the focus detection luminous flux will be explained. In the focus detection sensor 112, the F-number of the focus detection luminous flux is different in every focus detection field by controlling the light-receiving angle characteristic in every focus detection field. The size of the area through which the luminous flux passes on the exit pupil of the image-forming optical system 102 is large in the central focus detection field 112-1 and small in the peripheral focus detection field such as the focus detection field 112-4 (see FIG. 10).

Figure 20:
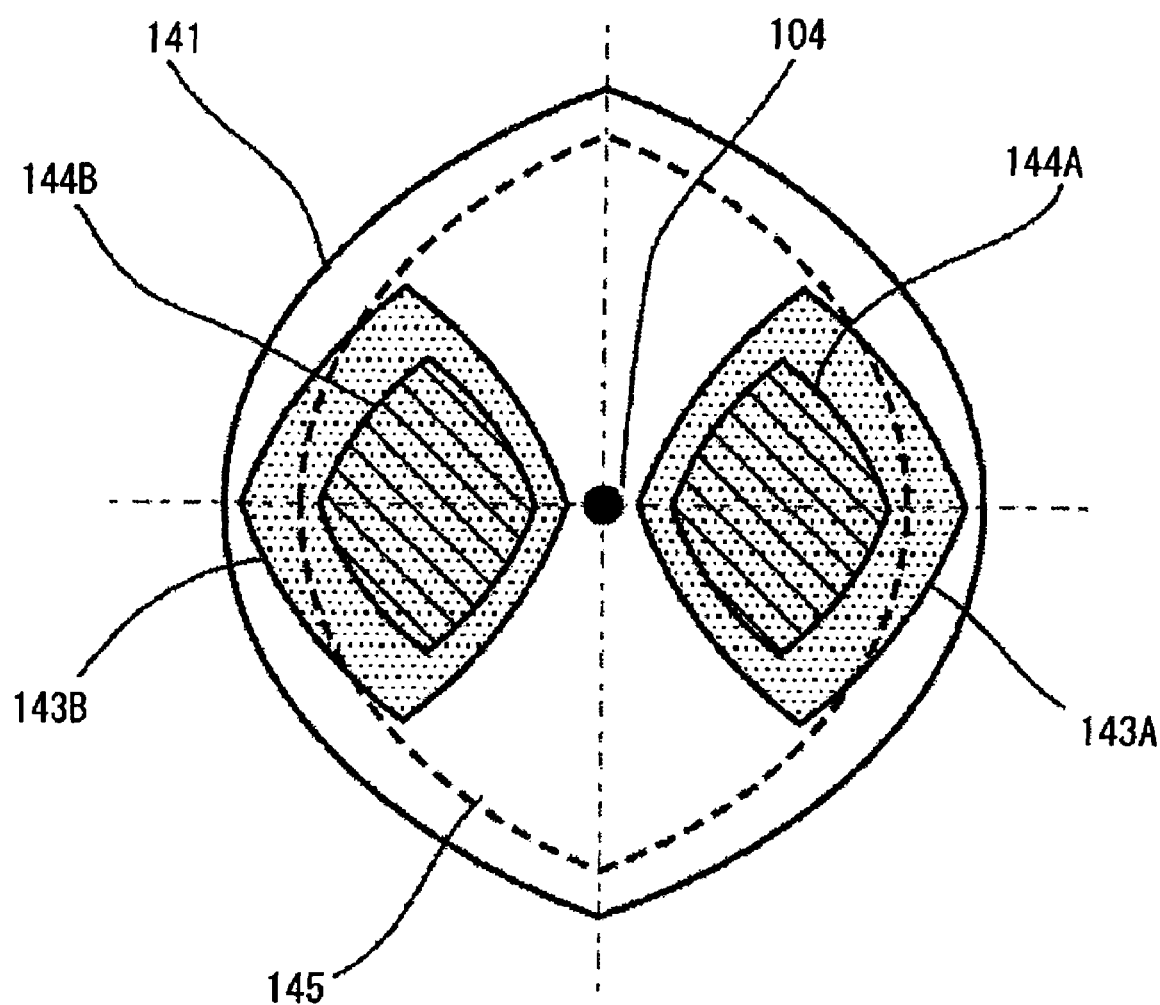
FIG. 20 is a figure for explaining the passing area through which a focus detection luminous flux passes on the exit pupil of the image-forming optical system provided in the digital color camera shown in FIG. 1.

FIG. 20 is a figure for explaining the passing area for the focus detection luminous flux on the exit pupil of the image-forming optical system 102. The pupil area 141 shows the vignetting of the image-forming optical system 102 when viewing from the end of the focus detection field 112-1, and the pupil area 145 shows the vignetting of the image-forming optical system 102 when viewing from the end of the focus detection fields 112-4, 112-5, 112-6 and 112-7. In contrast, the passing areas 143A and 143B for the focus detection luminous flux in the focus detection field 112-1 is inside the pupil area 141, and the passing areas 144A and 144B for the focus detection luminous flux in the focus detection field 112-4 is inside the pupil area 145.

Widening the passing area for the focus detection luminous flux makes it possible to perform focus detection with high accuracy even if the object luminance is low because the amount of light projected to the sensor increases. When this structure is seen from the viewpoint of the usability of object light, the actual passing area is large in the central focus detection field 112-1 in which the pupil area is large by the characteristics of the image-forming optical system. In contrast, the actual passing area is small in the peripheral focus detection field 112-4 in which the pupil area is small by the characteristics of the image-forming optical system and shading is easy to occur. Therefore, two requirement of the light amount in the center of the screen and disposition of the focus detection field in the peripheral area of the screen are nicely met, and thereby achieving extremely efficient use of the object light.

Figure 22:
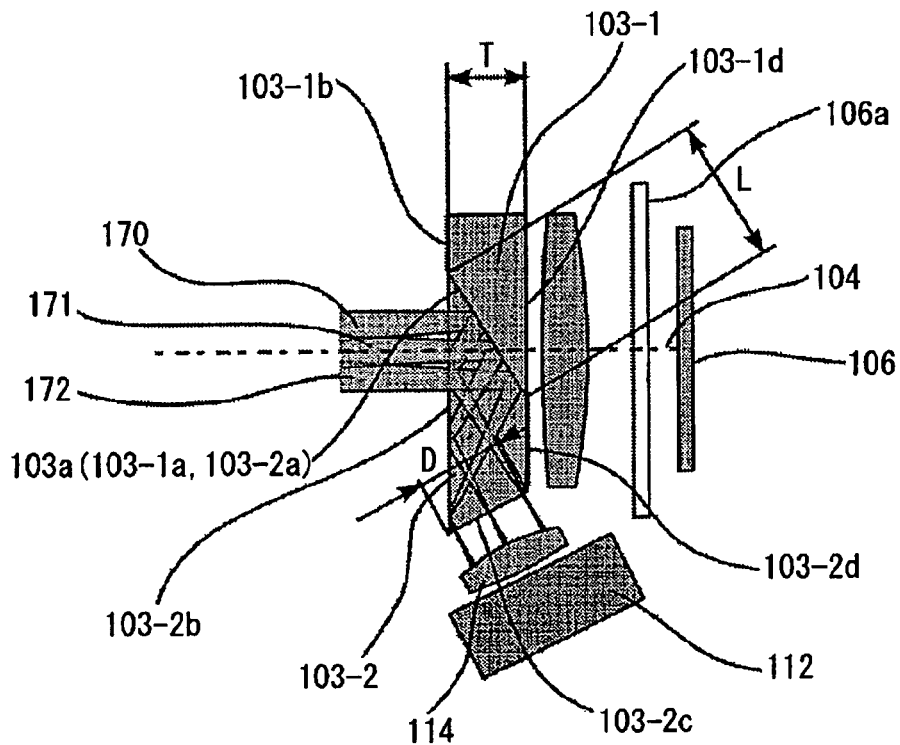
FIG. 22 is a sectional view of the beam splitter and the focus detection luminous flux in the digital color camera shown in FIG. 1.

Next, the passing area for the focus detection luminous flux on the beam splitter 103 will be explained. FIG. 22 is a sectional view of the beam splitter portion, which includes the focus detection luminous flux. In FIG. 22, reference numeral 170 denotes a focus detection luminous flux directing to the focus detection field 112-3 of the focus detection sensor 112, 171 a focus detection luminous flux directing to the focus detection field 112-1, and 172 a focus detection luminous flux directing to the focus detection field 112-2. The focus detection luminous fluxes 170, 171 and 172 are reflected at the beam splitting function surface 103a, and then totally reflected at the surface 103-2b by the refractive index difference between air and the prism 103-2, and emerged from the surface 103-2c. In this section, of the entire focus detection luminous flux, the focus detection luminous fluxes 170 and 172 pass through the outermost area. Therefore, it is only necessary to focus on the focus detection luminous fluxes 170 and 172 for determining the size of the effective area of each surface.

Since the beam splitter 103 is part of the image-forming optical system 102, minimizing the thickness of the beam splitter 103 is better for miniaturizing the image-forming optical system 102. Particularly, in a case where the image-forming optical system 102 is collapsed to house it in the camera body, lengthenning the air interval between the optical surfaces of the image-forming optical system 102 makes it possible to shorten the length of the image-forming optical system 102 in the housed state.

To minimize the thickness T of the beam splitter 103, it is only necessary to set the dimension L of the beam splitting function surface 103a and the dimension D of the surface 103-2c to at least a value added the minimum value allowing the focus detection luminous flux to pass and an error amount to consider in manufacturing.

Figure 21:
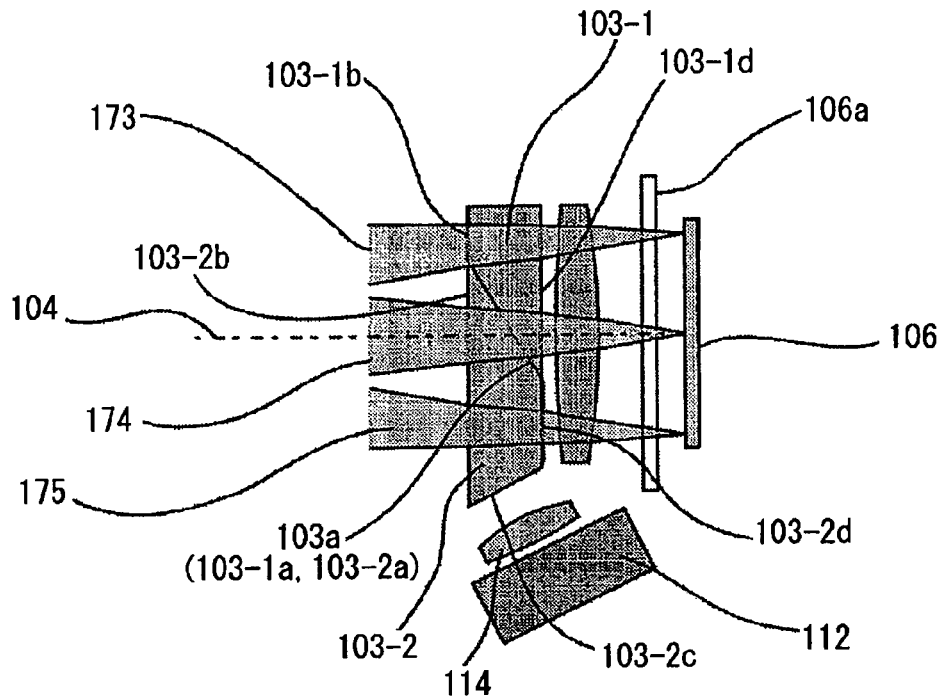
FIG. 21 is an explanatory diagram for an image-taking luminous flux in the digital color camera shown in FIG. 1.

If the thickness T is set based on such a concept, since the focus detection field is located at the vicinity of the center of the image-taking area as explained by FIG. 9, part of the image-taking luminous flux passes through the outside of the beam splitting function surface 103a. FIG. 21 is an explanatory diagram for an actual image-taking luminous flux. In this figure, reference numeral 173 denotes an image-taking luminous flux entering the upper end of the CMOS sensor 106, 174 an image-taking luminous flux entering the center of the CMOS sensor 106, and 175 an image-taking luminous flux entering the lower end of the CMOS sensor 106.

Since the image-taking luminous flux 174 passes through the beam splitting function surface 103a, the image-taking luminous flux 174 is emerged from the beam splitter 103 as light having an intensity distribution obtained by multiplication of the spectral transmittance characteristic of the beam splitting function surface 103a, described earlier using FIG. 7, and the spectral intensity characteristic of the object.

On the other hand, since the image-taking luminous fluxes 173 and 175 pass through the surface 103-1b of the prism 103-1 and the surface 103-2d of the prism 103-2, respectively, the image-taking luminous fluxes 173 and 175 are emerged from the beam splitter 103 as light having an intensity distribution obtained by multiplication of the spectral transmittance characteristic of the ND filter, described earlier using FIG. 8, and the spectral intensity characteristic of the object.

Figure 23:
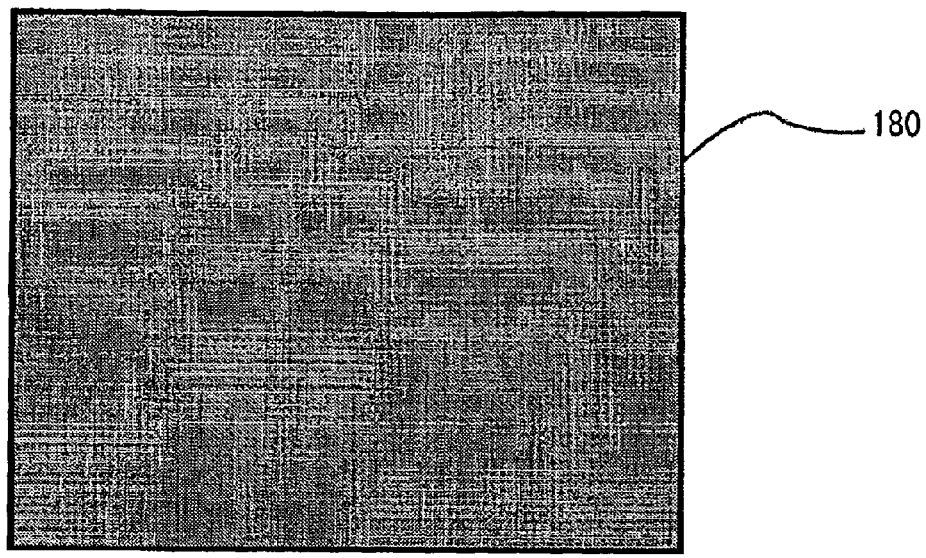
FIG. 23 is a chart showing the generation degree of uneven luminance on an image in the digital color camera shown in FIG. 1.

Since there is little difference between the spectral transmittances of the beam splitting function surface 103a, the surface 103-1b and the surface 103-2d in the visible wavelength region, if an optical image of a surface with substantially even luminance is taken, it is possible to obtain a taken image 180 with a substantially even luminance distribution (light amount distribution) as shown in FIG. 23. Therefore, the image-taking result has no particular luminance unevenness and no difference from normal images.

Herein, "substantially even" means not only a completely even state but also a state with only unevenness that can be deemed as virtual evenness. This is the same in the following explanation.

Figure 24:
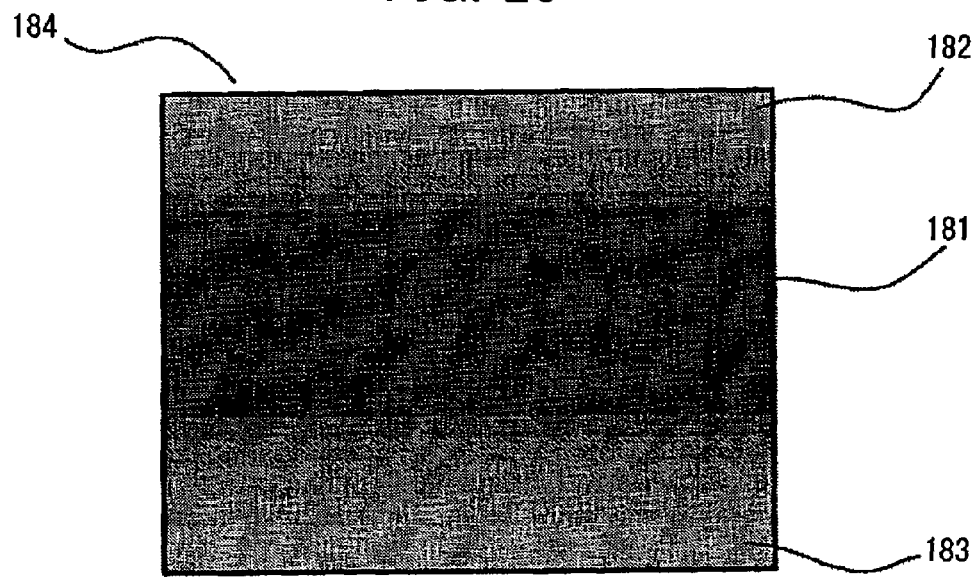
FIG. 24 is a chart showing the generation degree of uneven luminance on an image in the digital color camera shown in FIG. 1.

If the ND filter is not formed on the surface 103-1b of the prism 103-1 and the surface 103-2d of the prism 103-2, the beam splitter 103 having a transmittance of approximately 100%, the taken image of the object becomes an image 181 in which bright areas 182 and 183 are formed above and below the dark center area 181, as shown in FIG. 24. Therefore, the effect adjusting the transmittance using the ND filter is extremely large.

According to the above-described Embodiment 1, the camera has the beam splitter 103m including the beam splitting function surface 103a, which is the first surface, and the surface 103-1b of the prism 103-1 and the surface 103-2d of the prism 103-2, which are the second surfaces. The beam splitting function surface 103a has an inclination angle with respect to the optical axis 104, and reflects a part of the luminous flux toward the focus detection sensor 112 and transmits the other part of the luminous flux toward the CMOS sensor 106. The surfaces 103-1b and 103-2d are orthogonal to the optical axis 104 and formed so as to contact with the beam splitting function surface 103a. The surfaces 103-1b and 103-2d transmit the incident light in the predetermined wavelength region other than the luminous flux incident to the beam splitting function surface 103a toward the CMOS sensor 106.

Furthermore, the ND filter reducing the transmittance for the predetermined wavelength region is provided on the surfaces 103-1b and 103-2d so that the light amount distribution on the CMOS sensor 106 may become a substantially even distribution when the light in the predetermined wavelength region from an object with a substantially even luminance distribution is incident to the beam splitting function surface 103a and the surfaces 103-1b and 103-2d.

In other words, in this embodiment, the beam splitter includes a first region (the beam splitting surface 103a and the portion in the vicinity thereof in the optical axis direction ) I, which reflects a part of the luminous flux and transmits the other part of the luminous flux toward the CMOS sensor 106, and a second region (portions above and below the beam splitting surface 103a) II, which transmits the incident light in the predetermined wavelength region other than the luminous flux incident to the first region toward the CMOS sensor 106.

In addition, the transmittance of the second region II for the predetermined wavelength region is substantially the same as that of the second region II. Herein, "substantially the same (or substantially identical)" means not only completely the same state but also a state with only difference that can be deemed as virtual sameness. This is the same in the following explanation.

Therefore, it is possible to make the light amount distribution on the CMOS sensor 106 substantially even when the luminous fluxes transmitted through the surface 103-1b of the prism 103-1 and the surface 103-2d of the prism 103-2 enter the CMOS sensor 106, and it is thereby possible to obtain a high quality image with little luminance unevenness based on the light transmitted through the beam splitter. In addition, since it is not necessary to increase the size of the beam splitting function surface to a size covering the entire image-taking luminous flux, the increase of the size of the camera is prevented.

Since, the spectral transmittance characteristic and the spectral reflectance characteristic of the beam splitter 103 (beam splitting function surface 103a) are substantially the same, it is possible to perform focus detection and photometry with high accuracy using the reflected luminous flux divided by the beam splitter 103.

Further, The optical length of the optical low-pass filter 113 for the transmitting luminous flux and the optical length of the beam splitter 103 are substantially the same. Therefore, in a case where the camera has a mode in which the beam splitter 103 is retracted and image-taking is performed, the focus is not changed and the correction of the focus is not required if the beam splitter 103 is retracted. Thereby, it is possible to perform image-taking processing rapidly without release time lag.

Embodiment 2

The digital color camera of Embodiment 2 of the present invention adopts digital signal correction processing to eliminate luminance unevenness of images caused by the beam splitter. In this embodiment, a ND filter is not provided on the surface 103-1b of the prism 103-1 and the surface 103-2d of the prism 103-2.

Although the electrical structure of the digital color camera is basically the same as that of Embodiment 1 in the block diagram shown in FIG. 2, it is characterized in that the RGB image processing circuit 131 in this embodiment includes a luminance unevenness correction circuit (gain adjuster or processor), which corrects the luminance unevenness, in addition to the white balance circuit, the gamma correction circuit and the interpolation calculation circuit generating a high-resolution image by interpolation calculation.

The RGB image processing circuit 131 performs the correction of luminance unevenness in the image signals from the CMOS sensor 106, which have been converted into digital signals by the A/D converter 130, and then sends the signal to the white balance circuit, the gamma correction circuit and the interpolation calculation circuit.

Figure 26:
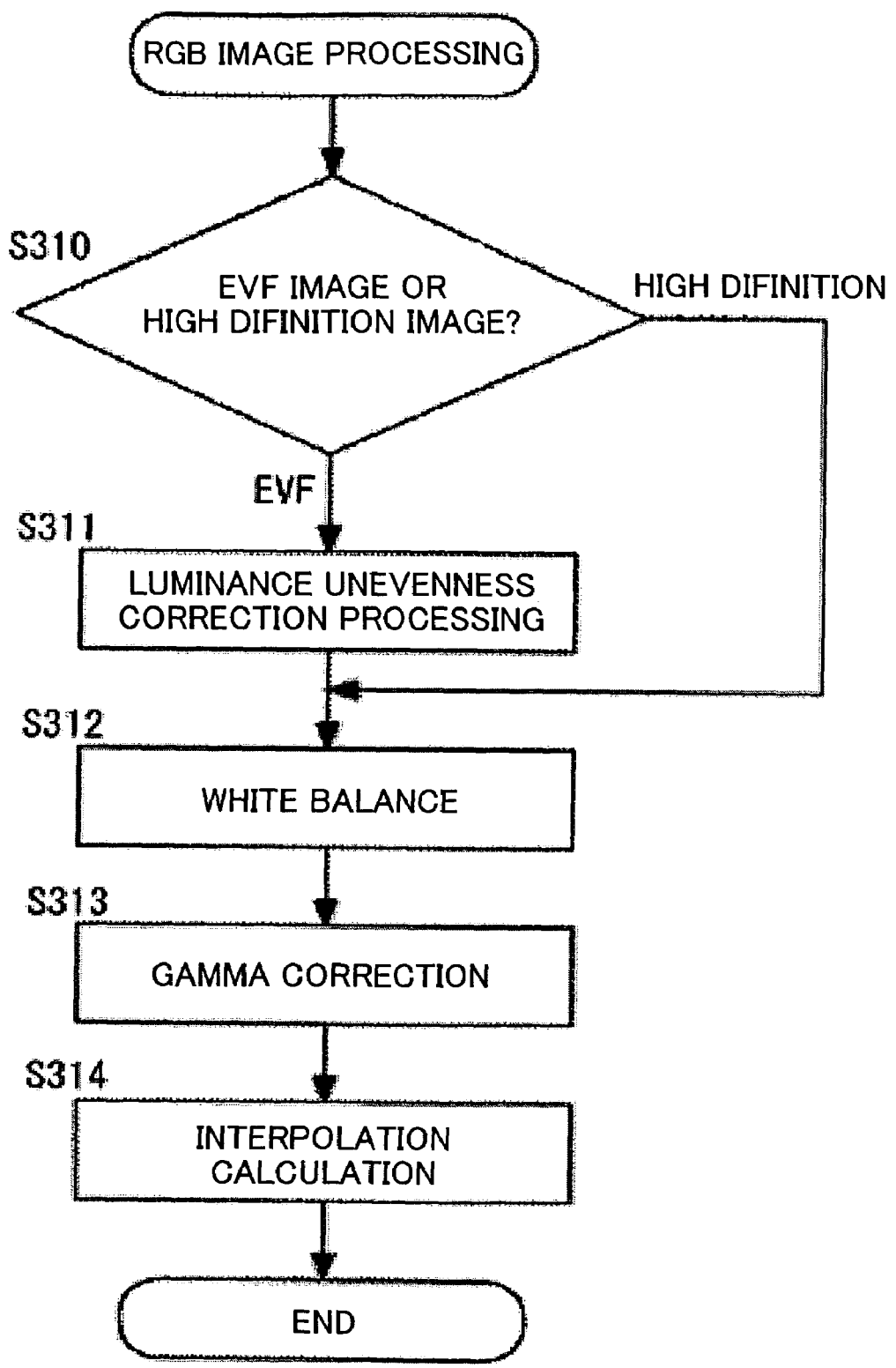
FIG. 26 is a flowchart showing the signal processing in the image processing circuit 131 in the digital color camera of Embodiment 2 of the present invention.

FIG. 26 is a flowchart showing the signal processing in the RGB image processing circuit 131. Hereinafter, the signal processing in the RGB image processing circuit 131 will be explained using the flowchart.

In the RGB image processing circuit 131, in the step S310 first, whether the taken image is an EVF image or a high definition image is determined. The "EVF" means an electric viewfinder, and the "high definition image" means an image generated by using the outputs of all pixels in the CMOS sensor 106. If the taken image is the EVF image, the process progresses to the step S311 because the image has been taken through the beam splitter 103. If the taken image is the high definition image, the process skips the step S311 and progresses to the step S311 because the image has not been taken through the beam splitter 103.

In the step S311, the correction of luminance unevenness is performed. The correction of luminance unevenness is a gain correction, which parameterizes the position of the horizontal pixel row constituting the image.

Figure 27:
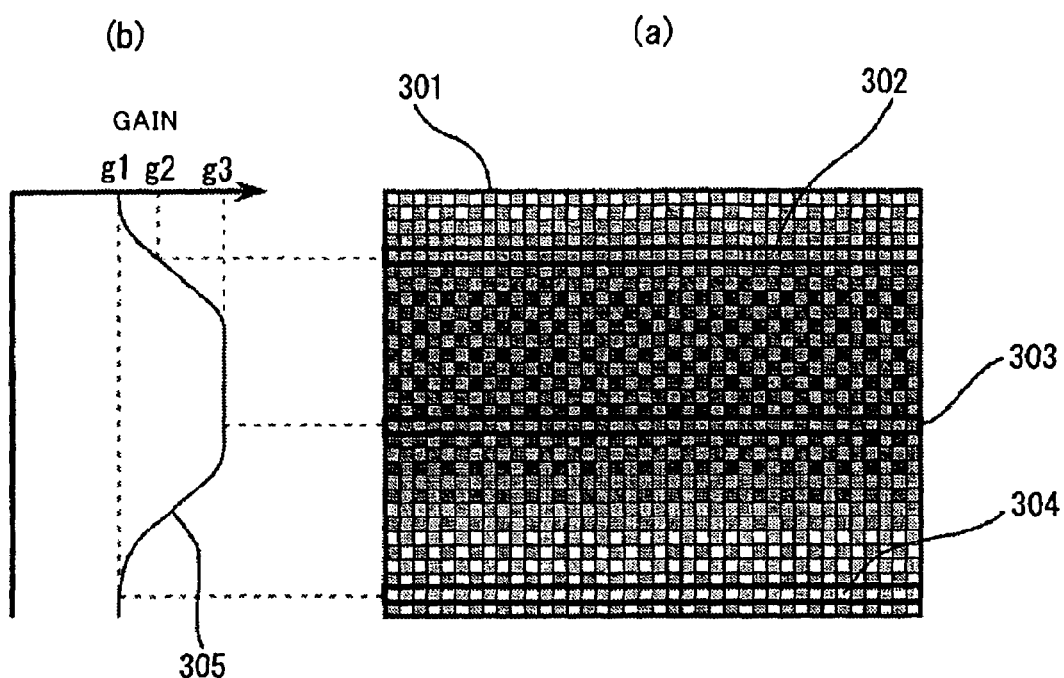
FIG. 27 is a chart showing the relationship between the positions on the image-taking screen and gains in the digital color camera of Embodiment 2.

FIGS. 27((a) and (b)) is a chart showing the relationship between the position in the taken image screen and the gain. In FIG. 27 (a), reference numeral 301 denotes an image in which the value of the digital signal, which is obtained by A/D-converting the output of the image taken for the EVF, is shown by brightness. In this step, there is a mosaic-like level difference caused by the light amount difference between R, G and B because the arrangement of the signal corresponds to the arrangement of pixel. However, the mosaic-like level difference is eliminated by the YC correction, and thereby forming a final visible image.

The calculation multiplying the image 301 shown in FIG. 27(a) by the gain shown by the characteristic 305 in FIG. 27(b) according to the position is performed. The gain characteristic 305 is a fixed characteristic that is determined by the positional relationship between the beam splitting function surface 103a of the beam splitter 103 and the CMOS sensor 106, and it has a constant value for the horizontal pixel row because the beam splitting function surface 103a passes transversely across the screen.

Figure 28:
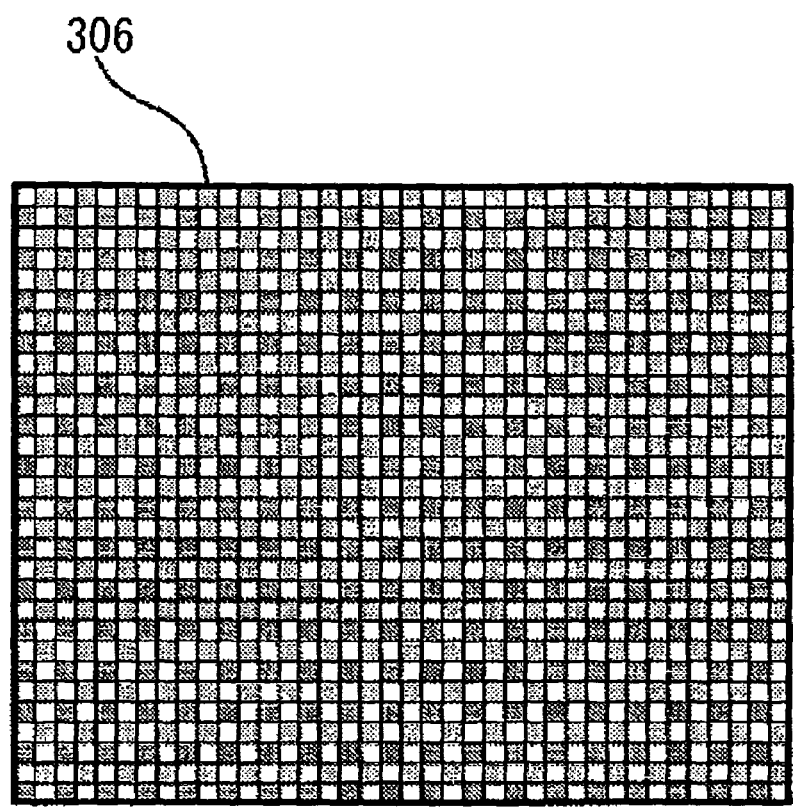
FIG. 28 is a chart showing the signal level after applying the gain in the digital color camera of Embodiment 2.

For example, the gain g2 is applied to the pixel row 302, the gain g3 is applied to the pixel row 303, and the gain g1 is applied to the pixel row 304. This results in the increase of the signal in an area darkened by the action of the beam splitting function surface 103a to an initial level as the image 306 shown in FIG. 28.

Thereby, the image processing is performed for making the luminance distribution of the image taken using the CMOS sensor substantially even when the predetermined wavelength region light from the object having a substantially even luminance distribution enters the first and second regions I and II (see FIG. 4) of the beam splitter 103.

Here, using the function of the aperture value of the aperture diaphragm provided in the image-forming optical system 102 as the gain characteristic can correct the luminance unevenness more strictly despite of the luminance.

In FIG. 26, in the step S312, the white balance processing is performed according to the kind of the light source such as the sun or a fluorescent lamp. Next, in the step 313, the gamma correction appropriate for an input/output device of image data is performed to reproduce the image faithfully. In the step 314, the generation of a high-resolution image by interpolation calculation is performed as the preprocessing for the YC processing, and the routine of the RGB image processing is returned.

Figure 29:
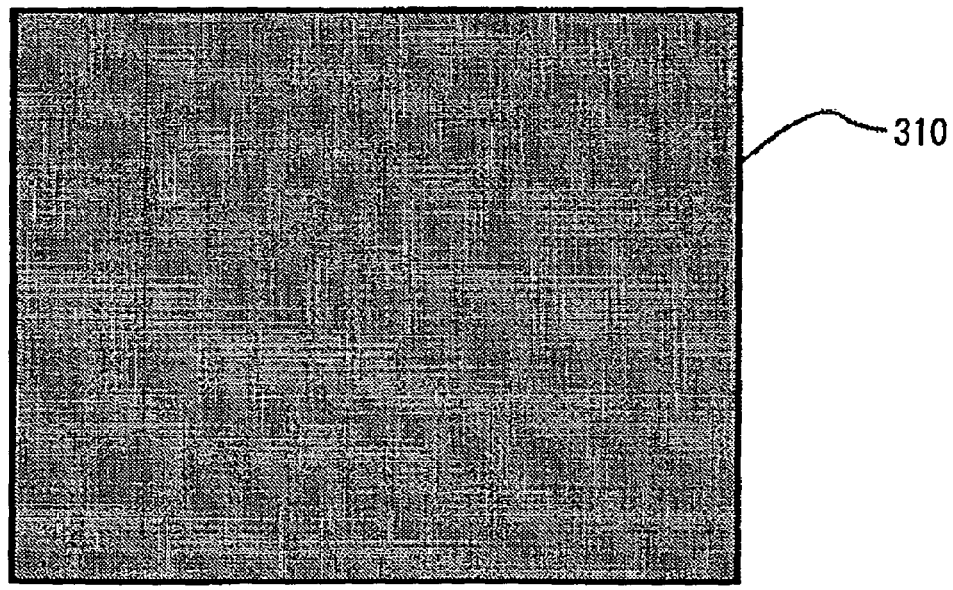
FIG. 29 is a chart showing the generation degree of uneven luminance on an image in a conventional digital color camera.
Figure 30:
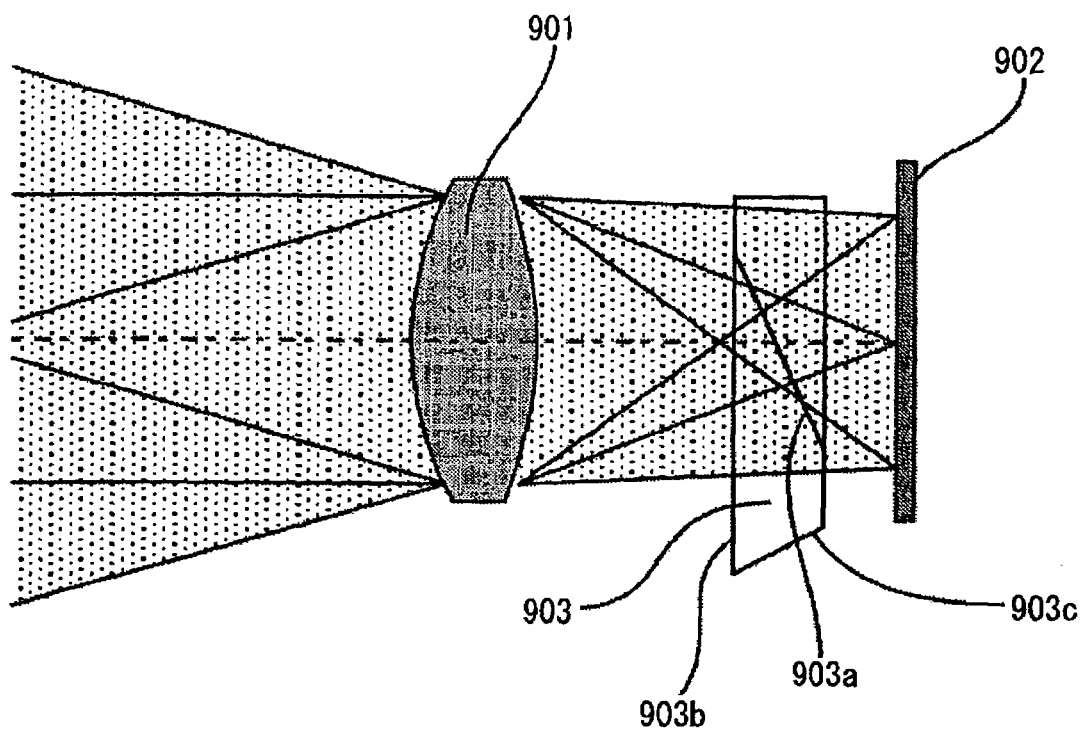
FIG. 30 is a pattern diagram showing an appearance of generation of the uneven luminance in the conventional digital color camera.
Figure 31:
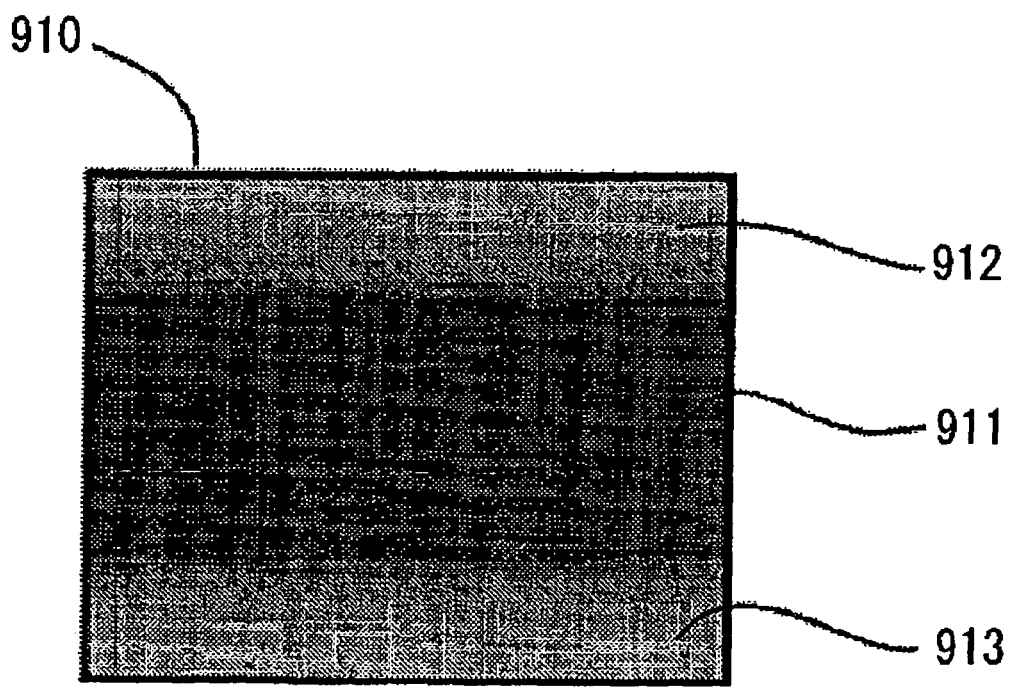
FIG. 31 is a chart showing the generation degree of uneven luminance on an image in a conventional digital color camera.

According to the above-described processing, the final image obtained by taking the even luminance surface becomes the even luminance image 310 as shown in FIG. 29, the image-taking result has no particular luminance unevenness and no difference from normal images. Therefore, the effect of the luminance unevenness correction is extremely large.

According to Embodiment 2, since the RGB image processing circuit 131 has the gain correction circuit that corrects the luminance unevenness, it is possible to make the output distribution of the CMOS sensor 106 in the image-taking screen substantially even when the image of the object having a substantially even luminance distribution is taken.

Therefore, it is possible to obtain a high quality image based on the light that has passed through the beam splitter 103. Furthermore, it is possible to prevent the increase of the size of the camera because it is not required to enlarge the size of the beam splitting function surface for preventing the luminance unevenness.

In addition, the camera of Embodiment 2 is characterized in that the optical lengths of the beam splitter and the optical low-pass filter for the straight-advancing light in the predetermined wavelength region are substantially the same. Therefore, since the focus is not changed and the correction of the focus is not required in a case of image-taking of a high definition image in a state in which the beam splitter is retracted, it is possible to shorten the release time lag.

According to the above-described embodiments, it is possible to obtain a high-quality image based on the output from the light-receiving element that has received light transmitted through the beam splitter without increasing the size of the beam splitter and the optical apparatus.

What is claimed is:

1. An optical apparatus comprising:

a light-receiving element, which has sensitivity to light in a predetermined wavelength region;

a beam splitter, which has an inclination angle with respect to an incident optical axis and includes a first surface and a second surface, the first surface reflecting part of incident light in the predetermined wavelength region and transmitting the other part of the incident light toward the light-receiving element, and the second surface being formed so as to be orthogonal to the incident optical axis and to contact with the first surface, and the second surface transmitting incident light in the predetermined wavelength region other than the incident light to the first surface toward the light-receiving element;

a gain adjuster, which adjusts a gain to an output from the light-receiving element so as to make an output distribution after adjustment substantially even in a case where the light from an object having a substantially even luminance is incident to the first and second surfaces; and an optical low pass filter, which is disposed in place of the beam splitter, wherein, in the predetermined wavelength region, an optical length for the light transmitted through the optical low pass filter is substantially the same as an optical length for the light transmitted through the beam splitter.

* * * * *